(12) United States Patent
Sasaki

(10) Patent No.: US 12,349,300 B2
(45) Date of Patent: Jul. 1, 2025

(54) AIRTIGHT CONNECTION UNIT, AIRTIGHT CONNECTION ASSEMBLY, AIRTIGHT CONTAINER AND VAPORIZER, AS WELL AS PRODUCTION METHOD OF AIRTIGHT CONNECTION ASSEMBLY

(71) Applicant: Kuwana Metals, Ltd., Kuwana (JP)

(72) Inventor: Akira Sasaki, Mie (JP)

(73) Assignee: Kuwana Metals, Ltd., Kuwana (JP)

(*) Notice: Subject to any disclaimer, the term of this patent is extended or adjusted under 35 U.S.C. 154(b) by 531 days.

(21) Appl. No.: 17/763,314

(22) PCT Filed: Sep. 17, 2020

(86) PCT No.: PCT/JP2020/035184
§ 371 (c)(1),
(2) Date: Mar. 24, 2022

(87) PCT Pub. No.: WO2021/065529
PCT Pub. Date: Apr. 8, 2021

(65) Prior Publication Data
US 2022/0368066 A1 Nov. 17, 2022

(30) Foreign Application Priority Data
Sep. 30, 2019 (JP) .................. 2019-179266

(51) Int. Cl.
*H05K 5/06* (2006.01)
*H01R 13/52* (2006.01)

(52) U.S. Cl.
CPC ......... *H05K 5/069* (2013.01); *H01R 13/5202* (2013.01); *H01R 13/5205* (2013.01); *H01R 13/5219* (2013.01)

(58) Field of Classification Search
None
See application file for complete search history.

(56) References Cited

U.S. PATENT DOCUMENTS

| | | | | |
|---|---|---|---|---|
| 3,803,531 A | * | 4/1974 | Sorensen | G21C 17/116 439/565 |
| 3,882,262 A | * | 5/1975 | Korner | G21C 17/116 376/310 |

(Continued)

FOREIGN PATENT DOCUMENTS

| CN | 101713397 A | 5/2010 |
|---|---|---|
| CN | 104685719 A | 6/2015 |

(Continued)

OTHER PUBLICATIONS

International Search Report and Written Opinion received for International PCT Application Serial No. PCT/JP2020/035184 dated Oct. 27, 2020, 15 pages.

*Primary Examiner* — Oscar C Jimenez
(74) *Attorney, Agent, or Firm* — NOD Law PC

(57) ABSTRACT

An airtight connection assembly comprising conducting members constituting passages of a signal or fluid, a sealing part including a first sealing member with a shape which can cover a first hole formed in a partition of an airtight container and a sealing material, and a connecting part comprising a connector connected to either or both of ends of the conducting members, second holes formed in said first sealing member so as to communicate the inside and outside of the airtight container with each other, the conducting members are individually inserted through the second holes, and gaps between the conducting members and inner circumferential surfaces of the second holes are filled with a sealing material. Thereby, it is made possible to deliver and receive an electric signal etc. between the inside and outside of the airtight container while maintaining airtightness of the airtight container by a simple configuration.

20 Claims, 18 Drawing Sheets

(56) References Cited

U.S. PATENT DOCUMENTS

| | | | |
|---|---|---|---|
| 4,670,623 A | 6/1987 | Siffrin | |
| 5,101,710 A | 4/1992 | Baucom | |
| 2003/0151861 A1* | 8/2003 | Moore, Jr. | H01R 13/5216 |
| | | | 361/22 |
| 2006/0222507 A1 | 10/2006 | Jayanth | |
| 2014/0045369 A1 | 2/2014 | Klaassen et al. | |
| 2014/0138920 A1 | 5/2014 | Munroe et al. | |
| 2015/0035552 A1* | 2/2015 | Hanaoka | H01R 13/5213 |
| | | | 324/691 |
| 2018/0277981 A1* | 9/2018 | Miura | H02G 3/22 |
| 2021/0036458 A1* | 2/2021 | Aoki | H01R 13/748 |

FOREIGN PATENT DOCUMENTS

| | | |
|---|---|---|
| JP | S57-211255 A | 12/1982 |
| JP | S61006277 U | 1/1986 |
| JP | S63-211577 A | 9/1988 |
| JP | H6-017780 A | 1/1994 |
| JP | H10-21982 A | 1/1998 |
| JP | 2009-199787 A | 9/2009 |
| JP | 2015-528630 A | 9/2015 |

\* cited by examiner

AIRTIGHT CONNECTION UNIT, AIRTIGHT CONNECTION ASSEMBLY, AIRTIGHT CONTAINER AND VAPORIZER, AS WELL AS PRODUCTION METHOD OF AIRTIGHT CONNECTION ASSEMBLY

BACKGROUND

Field

The present invention relates to an airtight connection unit which makes it possible to deliver and receive an electric signal etc. between the inside and outside of an airtight container, in which an electric apparatus etc. is housed, while maintaining airtightness of the airtight container, and related products of the airtight connection unit, such as an airtight connection assembly, an airtight container and a vaporizer. Furthermore, the present invention relates also to a production method of the airtight connection assembly.

Background

In the art, a technology for preventing explosion induced by a spark generated from an electric apparatus by keeping pressure of a gas inside an airtight container housing the electric apparatus higher than pressure of a gas around the airtight container has been known. More specifically, a technology for preventing a gas, steam or dust with explosibility, flammability and pyrophoricity, for example, (which may be generally referred to as a "flammable substance" hereafter) from entering an airtight container by housing an electric apparatus inside the airtight container and keeping pressure of the gas in the airtight container (for example, an inert gas, such as a nitrogen gas) higher than pressure of a surrounding gas (see, e.g., U.S. Pat. No. 5,101,710).

The above-mentioned technology is effective even when a flammable substance exists inside an airtight container. For example, a tank in which the flammable substance is stored is housed in the airtight container, and the inside of the airtight container is filled with an inert gas. Thereby, even if the flammable substance leaks out of the tank, the flammable substance can be kept (stopped) inside the airtight container. In addition, since ambient air can be prevented from entering the airtight container by keeping pressure of the gas inside the airtight container higher than pressure of the ambient air, oxygen concentration inside the airtight container can be suppressed to less than a lower explosive limit concentration to prevent combustion and explosion of the flammable substance.

By the way, it may be required to supply electric power to an electric apparatus housed inside an airtight container from the outside of the airtight container or to take out an electric signal outputted from a sensor, etc. prepared in the electric apparatus or a tank housed inside the airtight container to the outside of the airtight container, for example. In such a case, it is common to deliver and receive the electric power and/or the electric signal as mentioned above between the inside and outside of the airtight container by using a special connector which is referred to as a "hermetic connector" or an "airtight terminal."

In a special connector as mentioned above, for example, a metallic outer ring and a lead wire are sealed airtightly and insulatively via glass, the metallic outer ring and the lead wire are electrically insulated, and airtightness of the airtight container is maintained (see, e.g., Japanese Patent Application Laid-Open (kokai) No. S57-211255). In addition, a cable for electrically connecting with other apparatus outside the airtight container, etc. can be connected to the lead wire with techniques, such as welding and soldering, for example. Alternatively, the cable, etc. can be also connected to the lead wire through a connector, for example.

SUMMARY

An aspect may be characterized as an airtight connection unit which makes it possible to deliver and receive a signal or fluid between the inside and outside of an airtight container via one or more conducting members inserted through a first hole passing through a partition of said airtight container. The airtight connection unit comprises a sealing part comprising a first sealing member that is a member having a tabular shape which is larger than said first hole and can cover said first hole and a connecting part comprising a connector which can be connected with either or both of ends of said conducting members, respectively. Second holes passing through said first sealing member are formed such that said conducting members inserted through said first hole can be inserted further through said second holes.

Another aspect may be characterized as an airtight connection assembly, which comprises the airtight connection unit above and said conducting members and in which said sealing part further comprises a sealing material, wherein said conducting members are individually inserted through said second holes, gaps between said conducting members and inner circumferential surfaces of said second holes are filled with said sealing material, and said connector is connected to either or both of ends of said conducting members.

Yet another aspect may be characterized as an airtight container comprising the airtight connection assembly described above wherein said first hole is blocked by said first sealing member covering said first hole and said conducting members are inserted through said first hole via said second holes to extend outside from the inside of said airtight container.

Another aspect may be characterized as a vaporizer comprising the airtight container described above and a tank housed inside said airtight container. In addition, a sensor is configured so as to output a detection signal corresponding to the amount and/or state of a gas and/or a gas material that is a substance used as a source of said gas housed inside said tank and/or a heater configured so as to be supplied electric power to heat the above-mentioned gas material. The vaporizer is configured such that said gas and/or said detection signal and/or said electric power is delivered and received between the inside and outside of said airtight container through said conducting members which said the airtight connection assembly comprises.

An additional aspect may be characterized as a production method of an airtight connection assembly which makes it possible to deliver and receive a signal or fluid between the inside and outside of an airtight container via one or more conducting members inserted through a first hole passing through a partition of said airtight container, wherein said airtight connection assembly comprises a sealing part comprising a first sealing member that is a member having a shape which can cover said first hole, and a connecting part comprising a connector which can be connected to either or both of ends of said conducting members, respectively, and second holes passing through said first sealing member are formed such that said conducting members inserted through said first hole can be inserted further through said second holes, and said production method of an airtight connection assembly includes connecting said connecter to at least one end of said conducting members, individually inserting said conducting members through said second holes, filling gaps between inner circumferential surfaces of said second holes and said conducting members with said sealing material, inserting said conducting members through said first hole, and fixing said first sealing member at a predetermined position on said partition to block said first hole with said first sealing member.

DETAILED DESCRIPTION

Technical Problem

Figure 1:
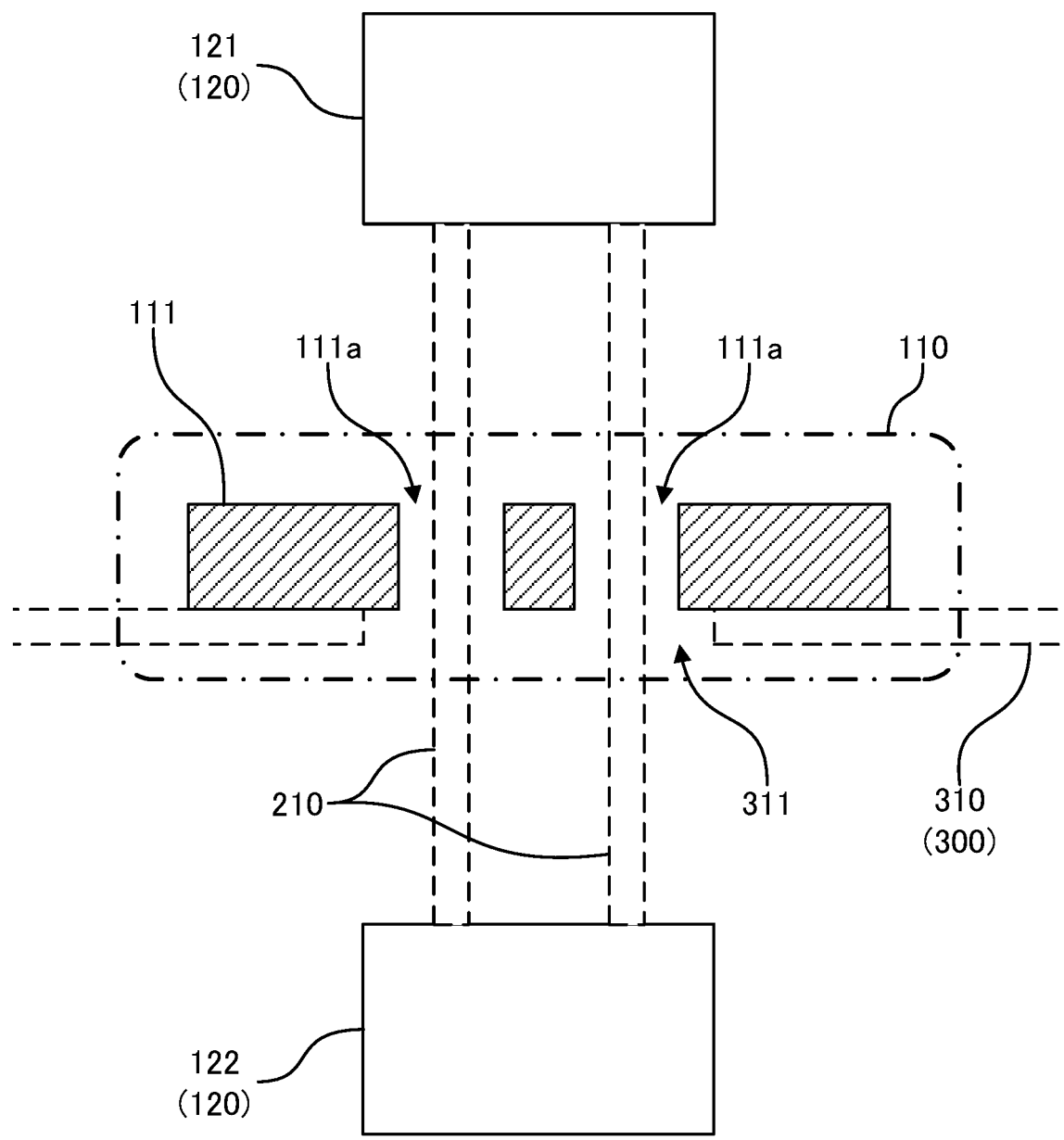
FIG. 1 is a schematic sectional view for showing an example of a configuration of an airtight connection unit according to a first embodiment of the present invention (first unit).

Commercially available hermetic connectors have a wide variety of variations with the different configurations such as a size and shape of a metallic outer ring, a thickness, shape and material of a lead wire, a material of a sealing material (for example, glass etc.), for example. However, the number of the variations is limited and it is not always easy to get a hermetic connector suitable for requirement specification in an intended use.

Moreover, as mentioned above, a cable for electrical connection with other apparatus outside and/or inside of an airtight container, etc. can be connected to a lead wire constituting a hermetic connector through a connector, for example. However, in conventional hermetic connectors, there is no unified specification (standard) about a configuration of lead wires (thickness, shape and material of each of the lead wires, and arrangement of the lead wires, etc.). For this reason, in order to make it easy to connect the lead wires constituting the conventional hermetic connector and the cables as mentioned above, it is necessary to prepare an exclusive connector according to (the configuration of the lead wires in) each of the hermetic connectors. As a result, for example, there is a possibility that it may lead to problems, such as a cost increase of equipment comprising the airtight container etc. which comprises the hermetic connector (for example, vaporizer etc.).

As mentioned above, in the art, a technology which makes it possible to deliver and receive an electric signal etc. between the inside and outside of an airtight container while maintaining airtightness of the airtight container by a simple configuration is demanded.

Solution to Problem

In view of the above-mentioned subjects, as a result of diligent research, the present inventor has found out that the above-mentioned demand could be met by realizing three functions of insulation, sealing and connection which are realized by a single structure in the conventional hermetic connectors with a plurality of structures.

Specifically, an airtight connection unit according to the present invention (which may be referred to as the "present invention unit" hereafter) is an airtight connection unit which makes it possible to deliver and receive a signal or fluid between the inside and outside of an airtight container via one or more conducting members inserted through a first hole passing through the partition of the airtight container. The present invention unit comprises a sealing part and a connecting part. The sealing part comprises a first sealing member that is a member having a shape which can cover the first hole. The connecting part comprises a connector which can be connected to either or both of ends of the conducting members, respectively. In the present invention unit, second holes passing through the first sealing member are formed such that the conducting members inserted through the first hole can be inserted further through the second holes.

Moreover, an airtight connection assembly according to the present invention (which may be referred to as the "present invention assembly" hereafter) is an airtight connection assembly comprising the above-mentioned present invention unit and conducting members, wherein the sealing part further comprises a sealing material. Furthermore, the conducting members are individually inserted through the second holes, and gaps between the conducting members and inner circumferential surfaces of the second holes are filled with the sealing material. In addition, the connector is connected to either or both of ends of the conducting members.

Furthermore, an airtight container according to the present invention (which may be referred to as the "present invention container" hereafter) is an airtight container comprising the above-mentioned present invention assembly. Furthermore, the first hole is blocked by the first sealing member covering the first hole. In addition, the conducting members are inserted through the first hole via the second holes to extend outside from the inside of the airtight container.

In addition, a vaporizer according to the present invention (which may be referred to as the "present invention vaporizer" hereafter) is a vaporizer comprising the above-mentioned present invention airtight container, a tank housed inside the present invention airtight container and a sensor and/or a heater. The sensor is configured so as to output a detection signal corresponding to the amount and/or state of a gas and/or a gas material that is a substance used as a source of the gas housed inside the tank. The heater is configured so as to be supplied electric power to heat the above-mentioned gas material. The present invention vaporizer is configured such that the gas, the detection signal and/or the electric power is delivered and received between the inside and outside of the present invention container through the conducting members which the present invention assembly comprises.

On the other hand, a production method of the airtight connection assembly according to the present invention (which may be referred to as the "present invention method" hereafter) is a production method of the above-mentioned present invention assembly, and includes processes listed below.

Connecting the connecter to either or both of ends of the conducting members, individually inserting the conducting members through the second holes, filling gaps between the inner circumferential surfaces of the second holes and the conducting members with the sealing material, inserting the conducting members through the first hole, and fixing the first sealing member at a predetermined position on the partition of the airtight container to block the first hole with the first sealing member.

Advantageous Effects of Invention

Since the sealing part which attains the functions for insulating and sealing the conducting members and the connector which attains the function for connecting the conducting members are configured as mutually different independent components in accordance with the present invention unit, selection range regarding configurations of the sealing part and the connecter is extended. For this reason, the present invention container which can make it possible to deliver and receive an electric signal etc. between the inside and outside of an airtight container while maintaining airtightness of the airtight container can be provided by assembling the present invention assembly, the present invention container and the present invention vaporizer, respectively, in accordance with simple configurations with high flexibility.

Namely, since a sealing part and a connector can be more freely configured in accordance with the present invention unit as compared with conventional technologies, the most suitable airtight connection unit for requirement specification can be easily realized. Moreover, since the present invention unit and/or the present invention assembly have a simple configuration, it is not necessary to prepare an exclusive connector and a cost of equipment comprising the airtight container can be reduced.

Other objectives, other features and accompanying advantages of the present invention will be easily understood from the following explanation about respective embodiments of the present invention, which will be described referring to drawings.

DESCRIPTION OF EMBODIMENTS

First Embodiment

<Configuration>
(1) Airtight Connection Unit

Hereafter, an airtight connection unit according to a first embodiment of the present invention (which may be referred to as a "first unit" hereafter) is explained, referring to drawings.

A first unit is an airtight connection unit which makes it possible to deliver and receive a signal or fluid between the inside and outside of an airtight container via one or more conducting members inserted through a first hole passing through the partition of the airtight container. The first unit comprises a sealing part and a connecting part.

The sealing part comprises a first sealing member that is a member having a shape which can cover the first hole. A shape of the first sealing member is not limited particularly as long as the shape can cover a first hole that is a penetration hole formed in a partition of the airtight container. Typically, the first sealing member is a tabular member larger than the first hole. Moreover, a material which constitutes the first sealing member is not limited particularly as long as it can withstand a use environment in an intended use of the airtight container to which the first unit is attached. Typically, the material which constitutes the first sealing member is a metal such as aluminum and iron, resin or the composite material thereof, for example.

The connecting part comprises a connector which can be connected to either or both of ends of the conducting members, respectively. In order to deliver and receive a signal transmitted by a conducting member or a fluid which flows through a passage constituted by a conducting member, the first unit is configured such that it is possible to connect a connecter for connecting conducting member (for example, a signal line which a sensor comprises or a piping inside which a fluid flows, etc.) which another apparatus or equipment comprises and a conducting member which an apparatus or equipment disposed inside the airtight container to which the first unit is applied comprises with either or both ends of the conducting members.

When the above-mentioned signal is an electric signal, the above-mentioned connector may be a plug or jack (including a receptacle) or a male or female of a bullet terminal, etc., for example. When the above-mentioned signal is an optical signal, the above-mentioned connector may be an optical connector, etc., for example. On the other hand, when a fluid flows through a passage constituted by the conducting member, the above-mentioned connector may be a joint, etc., for example. The number of the connectors connected to one end of the conducting members may be one or plural (namely, two or more). In the latter case, the plurality of the connectors may be the same kind of connectors, or may be different kinds of connectors. In the first unit, a commercially available common connector and/or a joint can be employed as a connector which the connecting part comprises.

As mentioned above, the first sealing member is a member having a shape which can cover the first hole. In a state where the airtight connection assembly according to the present invention manufactured from the first unit is attached to an airtight container, the first sealing member is disposed so as to cover the first hole. Means and/or methods for achieving and maintaining such a state are not limited particularly. For example, the first hole may be covered with the first sealing member by fixing the first sealing member to the partition of an airtight container with a fastening member, such as a bolt or a screw, inserted through a penetration hole formed in the partition of the airtight container and/or the first sealing member, or by fixing the first sealing member to the partition of the airtight container with adhesives, etc. In order to make it possible to give and receive a signal and/or a fluid via the conducting member between the inside and the outside of the airtight container even in such a state, it is necessary that it is possible to extend the conduction member from the inside to outside of the airtight container through the first sealing member arranged so as to cover the first hole.

Therefore, in the first unit, second holes passing through the first sealing member are formed such that the conduction members inserted through the first hole can be further inserted through the second holes. The number, size and shape, etc. of the second holes are suitably designed according to the number, thickness and shape of the conducting members to be inserted into the second holes, for example. Moreover, the arrangement of the second holes does not necessarily need to correspond to the arrangement of the connection point between the connector and the conducting members in the connecting part. For example, as will be described in detail later, for the purpose of facilitating the operation for filling gaps between the inner circumferential surfaces of the second holes and the conducting members with a sealing material, etc., the plurality of the second holes may be spaced sufficiently apart from one another, and/or individual second holes may be arranged in the positions to be reached easily from surrounding. Thereby, even in the state where the first hole is covered by the first sealing member, it can be made possible to deliver and receive a signal and/or fluid via a conducting member between the inside and outside of an airtight container.

FIG. 1 is a schematic sectional view for showing an example of a configuration of the first unit. In FIG. 1, conducting members 210 and a partition 310 of an airtight container 300 to which the first unit is to be attached are illustrated with a dashed line. The airtight container 300 and the conducting members 210 are not included in constituting members of the first unit. The first unit 101 exemplified in FIG. 1 makes it possible to deliver and receive a signal and/or fluid via the conducting member 210, which is a member constituting a passage of the signal or fluid, between the inside and outside of the airtight container 300 while maintaining the airtightness of the airtight container 300. The first unit 101 comprises a sealing part 110 (part surrounded by a bold one dot chain line) and a connecting part 120.

Since the conducting member 210 will be mentioned in detail in an explanation about an airtight connection assembly which will be mentioned later, the explanation thereof is omitted here. The sealing part 110 comprises a first sealing member 111 that is a member having a shape which can cover a first hole 311 that is a penetration hole formed in the partition 310 of the airtight container 300. The first sealing member 111 exemplified in FIG. 1 is a tabular member made of aluminum (part hatched with right-upward diagonal lines).

In addition, the first unit 101 illustrated in FIG. 1 is in a state where the first sealing member 111 is fixed to the partition 310 of the airtight container 300 with bolts, which are not shown, so as to cover the first hole 311, to block the first hole 311. Second holes 111a which are penetration holes formed so as to communicate with the first hole 311 in this state are formed in the first sealing member 111. In other words, the first hole 311 is formed in the partition 310 of the airtight container 300 so as to have a size and shape which enables communication with all the second holes 111a.

The connecting part 120 exemplified in FIG. 1 comprises an external connector 121 and an internal connector 122 as the above-mentioned connectors. The external connector 121 is a connector configured so as to be connected to the conduction members 210 at one of ends of the conduction members 210 outside the airtight container 300 to make it possible to deliver and receive a signal and/or fluid between conducting members (for example, a signal line which a sensor comprises or a piping inside which a fluid flows, etc.) which another apparatus or equipment (not shown) outside the airtight container 300 comprises and the conducting members 210. On the other hand, the internal connector 122 is a connector configured so as to be connected to the conduction members 210 at other of ends of the conduction members 210 inside the airtight container 300 to make it possible to deliver and receive a signal and/or fluid between conducting members (for example, a signal line which a sensor comprises or a piping inside which a fluid flows, etc.) which another apparatus or equipment (not shown) inside the airtight container 300 comprises and the conducting members 210. For example, the external connector 121 and the internal connector 122 are commercially available connectors having terminals which can be electrically connected to each of the conducting members 210 which are electric wires.

As mentioned above, the number, size and shape, etc. of the second holes 111a formed in the first sealing member 111 is suitably designed according to the number, thickness and shape of the conducting members 210 to be inserted into the second holes 111a. In the first unit 101 exemplified in FIG. 1, two second holes 111a are arranged in the positions, which can be reached easily from surrounding, sufficiently apart from one another. Thereby, the operation for filling gaps between the inner circumferential surfaces of the second holes 111a and the conducting members 210 with a sealing material can be facilitated (which will be mentioned in detail later).

(2) Airtight Connection Assembly

Hereafter, an airtight connection assembly according to the first embodiment of the present invention (which may be referred to as a "first assembly" hereafter) will be explained, referring to drawings.

As mentioned at the beginning of the present specification, the present invention relates not only to the present invention unit which has the features as mentioned above but also to an airtight connection assembly. The "airtight connection assembly" is an assembly which comprises the present invention unit and makes it possible to deliver and receive an electric signal etc. between the inside and outside of an airtight container, in which an electric apparatus etc. is housed, while maintaining airtightness of the airtight container.

The first assembly is an airtight connection assembly which comprises the above-mentioned first unit and conducting members, wherein the sealing part further comprises a sealing material. Furthermore, the conducting members are individually inserted into the second holes, and gaps between the conducting members and the inner circumferential surfaces of the second holes are filled with the sealing material. In addition, the connector is connected to either or both of the ends of the conducting members. Since the details of the first unit had already been mentioned in the explanation of the above-mentioned first unit, the explanation thereof is omitted here.

The conducting member is a member constituting a passage of the signal or fluid. The signal transmitted by the conducting member is not particularly limited, and may be an electric signal (which includes not only a detection signal output from a sensor etc. and an instruction signal output from a control device, etc., but also an electric power output from electric power source equipment, etc. for example) or a signal, such as an optical signal, for example. When the above-mentioned signal is an electric signal, the conducting member is an electric wire, and the electric wire may be covered with an insulator and protective covering, etc., for example. When the above-mentioned signal is an optical signal, the conducting member is an optical fiber, and the optical fiber may be an optical cable covered with protective covering, etc., for example. On the other hand, the fluid flowing through the passage constituted by the conducting member is also not particularly limited, and may be a fluid such as a gas or a liquid, for example. In this case, the conducting member may be a tubular member such as tube or a pipe, in which a space serving as a channel through which the fluid flows, is formed. In addition, unlike the electric wire and the optical fiber, the tubular member such as a tube or a pipe does not necessarily need to be covered with an insulator and/or protective covering, etc.

In addition, the number of the conducting members which the first assembly comprises may be one or plural (namely, two or more). When the first assembly comprises a plurality of conductive members, as for those flowing through a plurality of passages constituted by the plurality of the conductive members, all of them may be electric signals, all of them may be optical signals, or all of them may be fluid. Furthermore, they may include at least two or more kinds of an electric signal, an optical signal and fluid.

The sealing material is not limited particularly as long as it is a material which can stay between the conducting members and the inner circumferential surfaces of the second holes to maintain airtightness in a use environment in an intended use of the airtight container to which the first assembly is attached. The concept represented by the term "airtightness" used here is not necessarily limited to a state where gas leakage is completely prevented, and includes a state where gas leakage is prevented to an extent required in the intended use of the airtight container to which the first assembly is attached.

As examples of the sealing material as mentioned above, polymeric organic materials including rubber such as silicon sealant and resin such as epoxy resin and ceramic materials such as glass can be exemplified, for example. Moreover, the polymeric organic materials as mentioned above may be a room temperature curing material, a thermosetting material and a thermoplastic material, as long as it can withstand the use environment in the intended use of the airtight container to which the first assembly is attached. Therefore, the materials which constitute the conducting member and the first sealing member need to withstand conditions at the time of filling and/or hardening of the sealing material. Alternatively, the sealing material may be a member constituted by a solid body, such as a grommet, which is previously molded along the shape of the second hole and has a penetration hole through which the conductive member is inserted formed therein.

A function for airtightly sealing the airtight container is exhibited by blocking the first hole with the sealing part containing the first sealing member and the sealing material as the above.

By the way, when a plurality of the conducting members is inserted into one second hole, there is a possibility that the airtightness cannot be sufficiently raised by filling the sealing material by the reason that gaps between the plurality of the conducting members are not sufficiently filled with the sealing material, for example. For this reason, in the first assembly, the conducting members are individually inserted into the second holes as mentioned above. Namely, one conducting member is inserted into one second hole, and a plurality of the conducting members are not inserted into one second hole.

Figure 2:
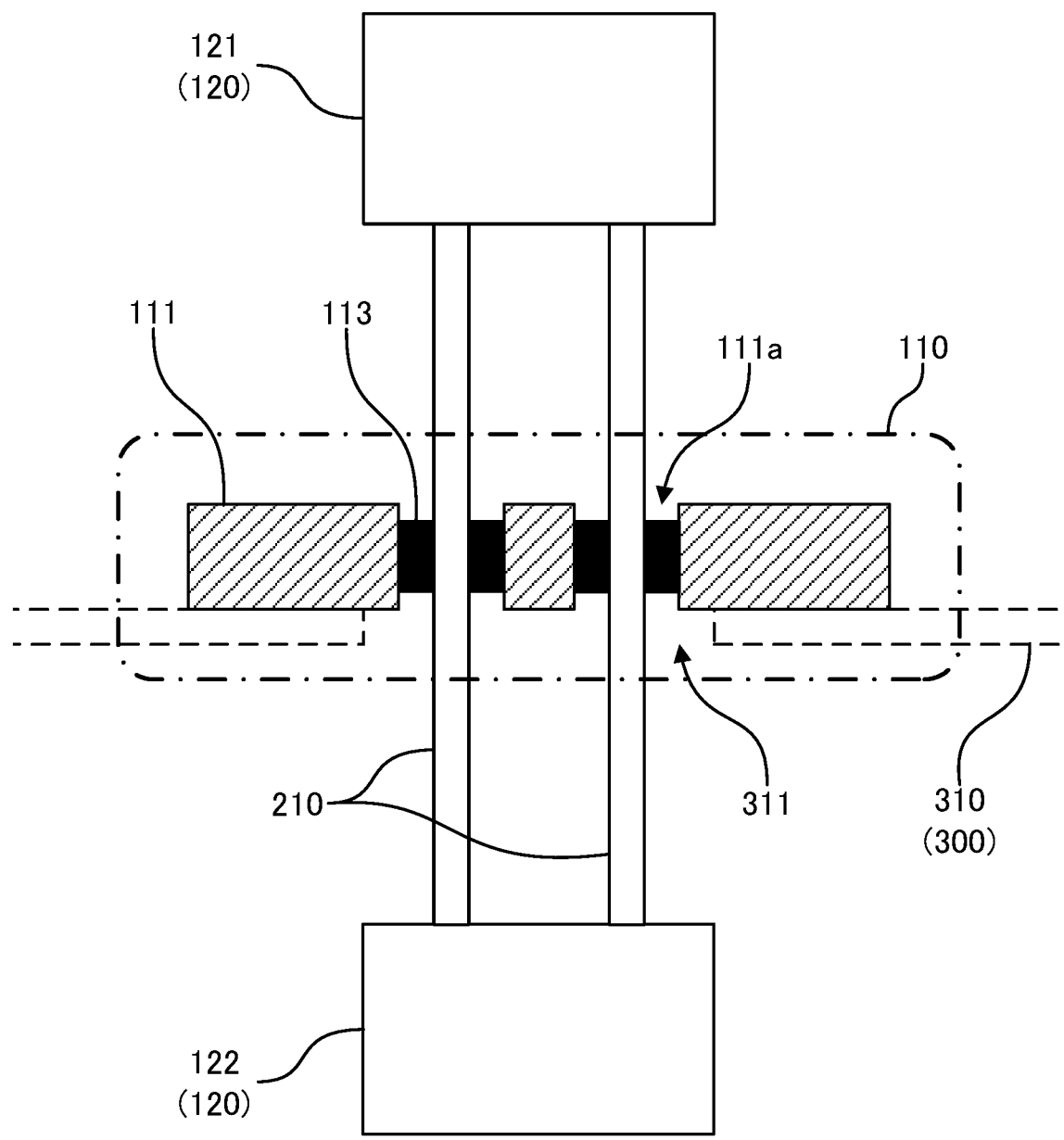
FIG. 2 is a schematic sectional view for showing an example of a configuration of an airtight connection assembly according to the first embodiment of the present invention (first assembly).

FIG. 2 is a schematic sectional view for showing an example of a configuration of the first assembly. In FIG. 2, the partition 310 of the airtight container 300 to which the first assembly is attached is illustrated with a dashed line. The airtight container 300 is not included in constituting members of the first assembly. The first assembly 201 exemplified in FIG. 2 is an airtight connection assembly comprising two conducting members 210, the sealing part 110 (part surrounded by a bold one dot chain line) and a connecting part 120. In other words, the first assembly 201 is an airtight connection assembly comprising the first unit 101 and two conducting members 210, wherein the sealing part 110 further comprises the sealing material 113. Two conducting members 210 are individually inserted through the second holes 111a, and gaps between the conducting members 210 and the inner circumferential surfaces of the second holes 111a are individually filled with the sealing material 113. The external connector 121 and the internal connector 122 are connected to both ends of the conducting members 210, respectively.

The conducting member 210 is an electric wire which transmits an electric signal, and the electric wire is covered with protective covering consisting of insulator. The sealing part 110 comprises the first sealing member 111 that is a member having a shape which can cover the first hole 311 that is a penetration hole formed in the partition 310 of the airtight container 300 and the sealing material 113. The first sealing member 111 is a tabular member made of aluminum (part hatched with right-upward diagonal lines), and the sealing material 113 is room temperature curing silicon sealant (black-filled part).

In FIG. 2, the first assembly 201 in a state where the first sealing member 111 is fixed to the partition 310 of the airtight container 300 with bolts, which are not shown, so as to cover the first hole 311, to block the first hole 311. As exemplified in FIG. 2, the first hole 311 is formed in the partition 310 of the airtight container 300 so as to have a size and shape which enables communication with all the second holes 111a.

Furthermore, the second holes 111a which are penetration holes formed so as to communicate the inside and outside of the airtight container 300 with each other in a state where the first sealing member 111 is fixed to the partition 310 of the airtight container 300 are formed in the first sealing member 111, the conducting members 210 are individually inserted into the second holes 111a, and the gaps between the conducting members 210 and the inner circumferential surfaces of the second holes 111a are filled with the sealing material 113, respectively.

Two second holes 111a exemplified in FIG. 2 are arranged sufficiently apart from one another in the positions to be reached easily from surrounding. Thereby, the operation for filling the gaps between the inner circumferential surfaces of the second holes 111a and the conducting members 210 with the sealing material can be facilitated, as mentioned above.

(3) Airtight Container

Hereafter, an airtight container according to the first embodiment of the present invention (which may be referred to as a "first container" hereafter) will be explained, referring to drawings.

As mentioned at the beginning of the present specification, the present invention relates not only to the present invention unit and the present invention assembly having the features as mentioned above, but also to an airtight container comprising the present invention assembly.

The first container is an airtight container comprising the above-mentioned first assembly. Since details of the first assembly had been already mentioned in the explanation about the above-mentioned first assembly, the explanation thereof is omitted here. Configuration of airtight containers, such as the size and shape of the first container and the material constituting the partition of the airtight container, can be suitably chosen according to apparatus and/or equipment housed in the airtight container, properties of fluid such as a gas, and a use environment in an intended use of the airtight container, etc., for example.

Moreover, in the first container, the first hole is blocked by the first sealing member, which the first assembly comprises, covering the first hole that is a penetration hole formed in the partition of the first container. Furthermore, the conducting members inserted into the first hole through the second holes which are penetration holes formed in the first sealing member are extending outside from the inside of the first container.

Figure 3:
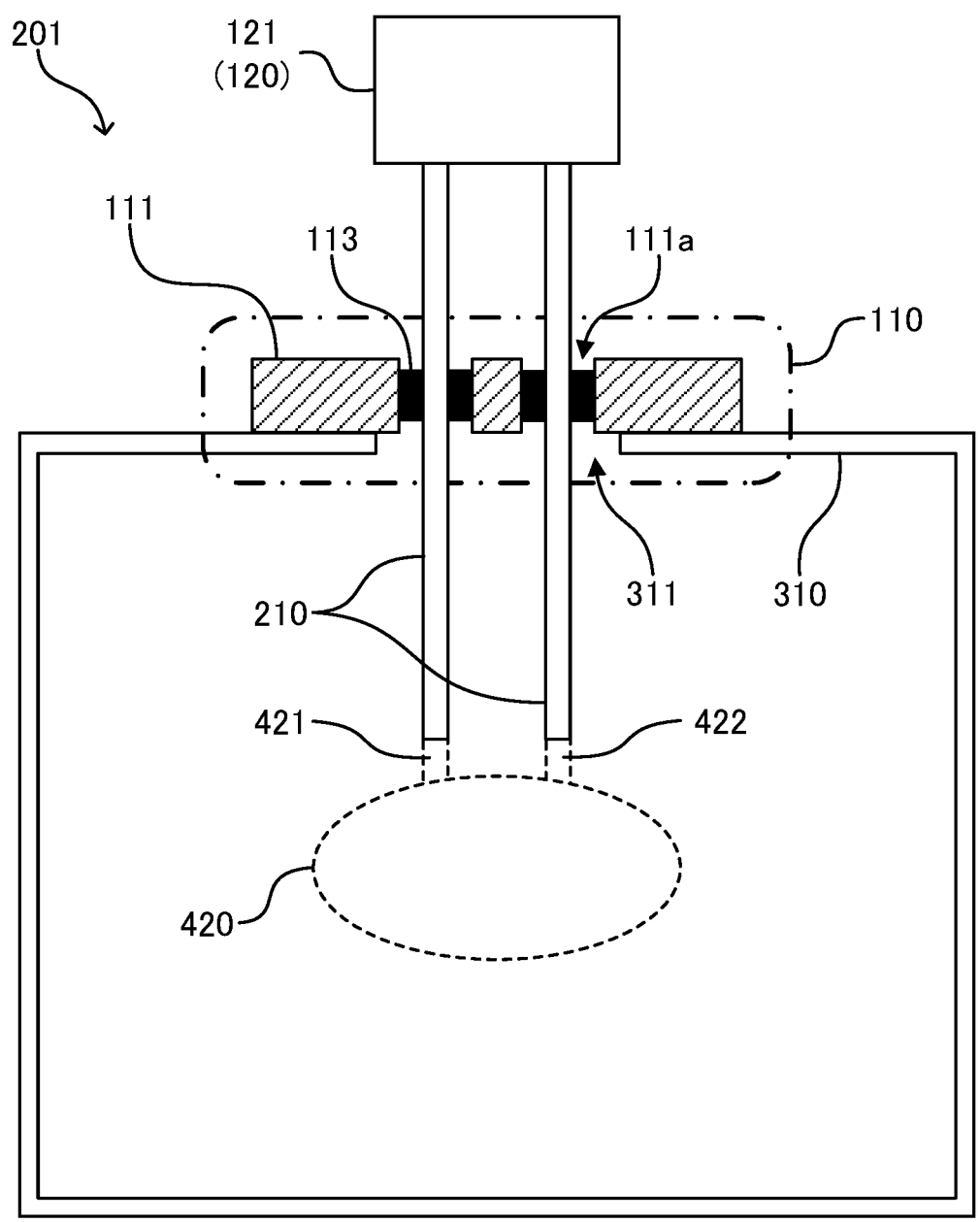
FIG. 3 is a schematic sectional view for showing an example of a configuration of an airtight container according to the first embodiment of the present invention (first container).

FIG. 3 is a schematic sectional view for showing an example of a configuration of the first container. The first container 301 exemplified in FIG. 3 is an airtight container comprising the first assembly 201. The first assembly 201 which the first container 301 comprises has the same configuration as the first assembly 201 shown in FIG. 2 except that the first assembly 201 does not comprise an internal connector. Moreover, also in the first container 301, the first hole 311 that is a penetration hole is formed in the partition 310, and the first hole 311 is blocked by the first sealing member 111 included in the sealing part 110 which the first assembly 201 comprises. Furthermore, the conducting members 210 inserted into the first hole 311 through the second holes 111a formed in the first sealing member 111 are extending outside from the inside of the first container 301.

In addition, a sensor 420 is housed inside the first container 301 (refer to an elliptical shape drawn by a dashed line), and the conducting members 210 are electric wires as passages for transmitting a detection signal output from the sensor 420, for example. However, the conducting members 210 may be electric power lines for supplying electric power to apparatus or equipment housed inside the first container 301, or may be piping, such as a tube or a pipe, for delivering and receiving fluid between a tank housed inside the first container 301 and the outside of the first container 301.

As mentioned above, the first assembly 201 which the first container 301 exemplified in FIG. 3 comprises does not comprise an internal connector. For this reason, in the example shown in FIG. 3, signal wires 421 and 422 with which the sensor 420 is comprised and the two conducting members 210 with which the first assembly 201 is comprised are connected directly, respectively. However, when the first assembly 201 with which the first container 301 is comprised comprises an internal connector, these can be easily connected by an internal connector.

(4) Vaporizer

Hereafter, a vaporizer according to the first embodiment of the present invention (which may be referred to as a "first vaporizer" hereafter) will be explained, referring to drawings.

As mentioned at the beginning of the present specification, the present invention relates not only to the present invention unit, the present invention assembly and the present invention container having the features as mentioned above, but also to a vaporizer comprising the present invention container.

The first vaporizer is a vaporizer comprising the above-mentioned first container, a tank housed inside the first container and a sensor and/or a heater. Since details of the first container had been already mentioned in the explanation about the above-mentioned first container, the explanation thereof is omitted here.

The tank is a container which houses a gas to be supplied by the first vaporizer and/or a gas material that is a substance used as a source of the gas, and the gas housed in the tank and/or the gas generated in the tank is derived from the inside to outside of the first container.

The sensor is configured so as to output a detection signal corresponding to the amount and/or state of the gas and/or the gas material that is the substance used as the source of the gas housed inside the tank. The amount of the gas and/or the gas materials means mass, volume and liquid level (when the gas material is liquid), etc. of the gas and/or the gas materials, for example. Moreover, the state of the gas and/or the gas materials means temperature, pressure, concentration of a specific component, etc. of the gas and/or the gas materials, for example.

The heater is configured so as to be supplied electric power to heat the above-mentioned gas material. As examples of such a heater, a resistance-heating type heater, a dielectric-heating type heater, a microwave-heating type heater and an induction-heating type heater, etc. can be exemplified, for example. Typically, the above-mentioned heater is a resistance-heating type heater.

In addition, the first vaporizer is configured such that the gas and/or the detection signal and/or electric power is delivered and received between the inside and the outside of the first container through the conducting members which the first assembly comprises.

In addition, the first vaporizer may be configured such that at least any one of the above-mentioned gas, detection signal and electric power is delivered and received between the inside and the outside of the first container without passing through the conducting members which the first assembly comprises. For example, the first vaporizer may comprise an output tube as a channel configured to lead out the gas from the inside of the tank to the outside of the airtight container separately from the conducting members. In this case, the configuration of the output tube is not limited particularly as long as it is possible to derive the gas from the inside of the tank to the outside of the airtight container, and can be suitably chosen according to the properties of the gas and a use environment in an intended use of the vaporizer, etc., for example.

Figure 4:
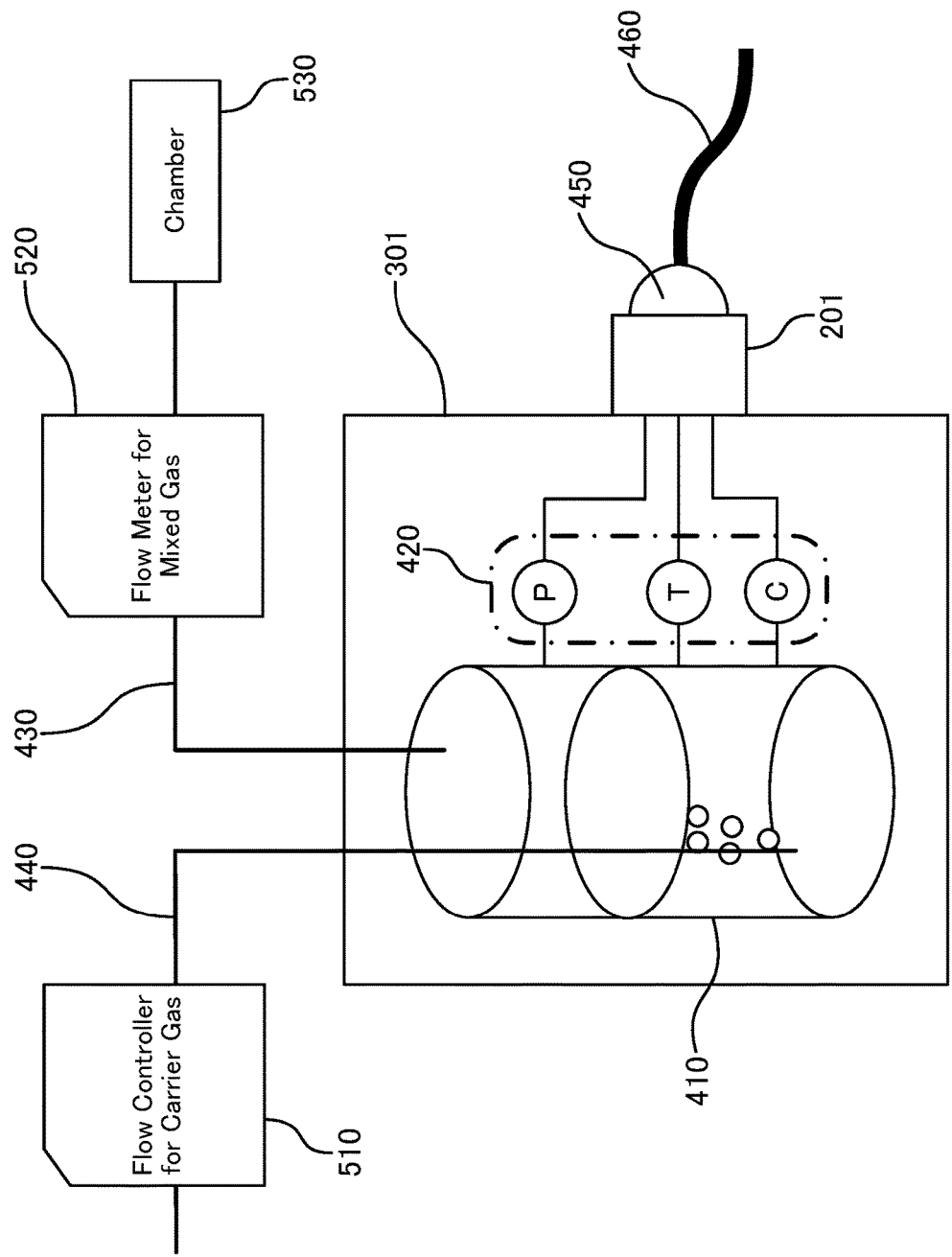
FIG. 4 is a schematic view for showing an example of a configuration of a vaporizer according to the first embodiment of the present invention (first vaporizer).

FIG. 4 is a schematic view for showing an example of a configuration of the first vaporizer. The first vaporizer 401 exemplified in FIG. 4 comprises the above-mentioned first container 301, a tank 410 housed in the inside of the first container 301, a sensor 420, and an output tube 430 which derives a gas generated inside the tank 410 from the inside to outside of the first container 301. In the example shown in FIG. 4, the sensor 420 is configured so as to detect a temperature (T) of a gas material (substance used as a source of the gas) stored inside the tank 410, a concentration (C) of a specific component of the gas material and a pressure (P) of the gas generated from the gas material. In the example shown in FIG. 4, a heater is not shown.

The first vaporizer 401 comprises an input tube 440 which introduces a career gas below the surface of the gas material stored in the tank 410. In addition, the first vaporizer 401 comprises a flow controller 510 which controls a flow rate of the career gas introduced into the inside of the tank 410 and a flow meter 520 which measures a flow rate of a mixed gas of the career gas and the gas generated from the gas material derived from the inside to outside of the first container 301 through the output tube 430.

The first vaporizer 401 with the configuration as mentioned above is configured so as to introduce the career gas below the surface of the gas material stored inside the tank 410 at a predetermined flow rate while keeping the temperature of the gas material stored inside the tank 410 and the pressure of the gas generated from the gas materials constant. And, the first vaporizer 401 derives the mixed gas of the gas generated from the gas material and the career gas from an exhaust port of the tank 410 to the outside of the first container 301 through the output tube 430. Namely, the first vaporizer 401 is a bubbling-type vaporizer.

In the first vaporizer 401 with the configuration as mentioned above, a flow rate Qs of the gas generated from the gas material can be calculated by subtracting a flow rate Q1 of the career gas measured by the flow controller 510 from the flow rate Q2 of the mixed gas measured by the flow meter 520 (Qs=Q2−Q1).

In a process in which the gas generated from the gas material as mentioned above is supplied to a predetermined destination (which is a chamber 530 in FIG. 4) at a predetermined flow rate, detection signals corresponding to the temperature (T) of the gas material, the concentration (C) of the specific component of the gas material and the pressure (P) of the gas generated from the gas material are output from the sensor 420. These detection signals are transmitted from the inside to outside of the first container 301 while maintaining the airtightness of the first container 301 by the first assembly 201 which the first container 301 comprises, and transmitted to a control device etc. (not shown) through a plug 450 connected to an external connector (not shown) which the first assembly 201 comprises and a cable 460 connected to the plug 450 to be used for flow control of the gas.

In addition, in the first container and the first vaporizer exemplified respectively referring to FIG. 3 and FIG. 4, the conducting members are configured as signal wires (electric wires) which transmit the detection signals output from the sensor to the outside from the inside. However, as mentioned above, the conducting member is a member which constitutes a passage of a signal or fluid. Moreover, the signal transmitted by the conducting member is not be limited to an electric signal, and may be an optical signal, for example. Furthermore, the fluid which flows through the passage constituted by the conducting member is not particularly limited, and may be fluid such as a gas or liquid, for example. Therefore, the conducting member may be an electric wire or an optical fiber, for example, or may be a tubular member, such as a tube or a pipe in which a space used as a channel through which fluid flows is formed inside, for example. Specifically, the input tube 440 and the output tube 430 which the first vaporizer 401 exemplified in FIG. 4 comprises may be configured so as to deliver and receive the gas and the gas material between the inside and outside of the first container 301 through the first assembly 201 disposed so as to cover a penetration hole (not shown) formed in the partition 310 of the first container 301.

(5) Production Method of Airtight Connection Assembly

Hereafter, a production method of an airtight connection assembly according to the first embodiment of the present invention (which may be referred to as a "first method" hereafter) will be explained, referring to drawings.

As mentioned at the beginning of the present specification, the present invention relates not only to the present invention unit, the present invention assembly, the present invention container, and the present invention vaporizer having the features as mentioned above, but also to a production method of the present invention assembly.

The first method is a production method of the above-mentioned first assembly. Since details of the first assembly had been already mentioned in the explanation about the above-mentioned first assembly, the explanation thereof is omitted here. Furthermore, the first method includes processes listed below.

Process A: Connecting the connecter to at least one end of the conducting members.

Process B: Individually inserting the conducting members through the second holes which are penetration holes formed in the first sealing member.

Process C: Filling gaps between inner circumferential surfaces of the second holes and the conducting members with the sealing material.

Process D: Inserting the conducting members through the first hole that is a penetration hole formed in the partition of the airtight container.

Process E: Fixing the first sealing member at a predetermined position on the partition of the airtight container to block the first hole with the first sealing member.

Figure 5:
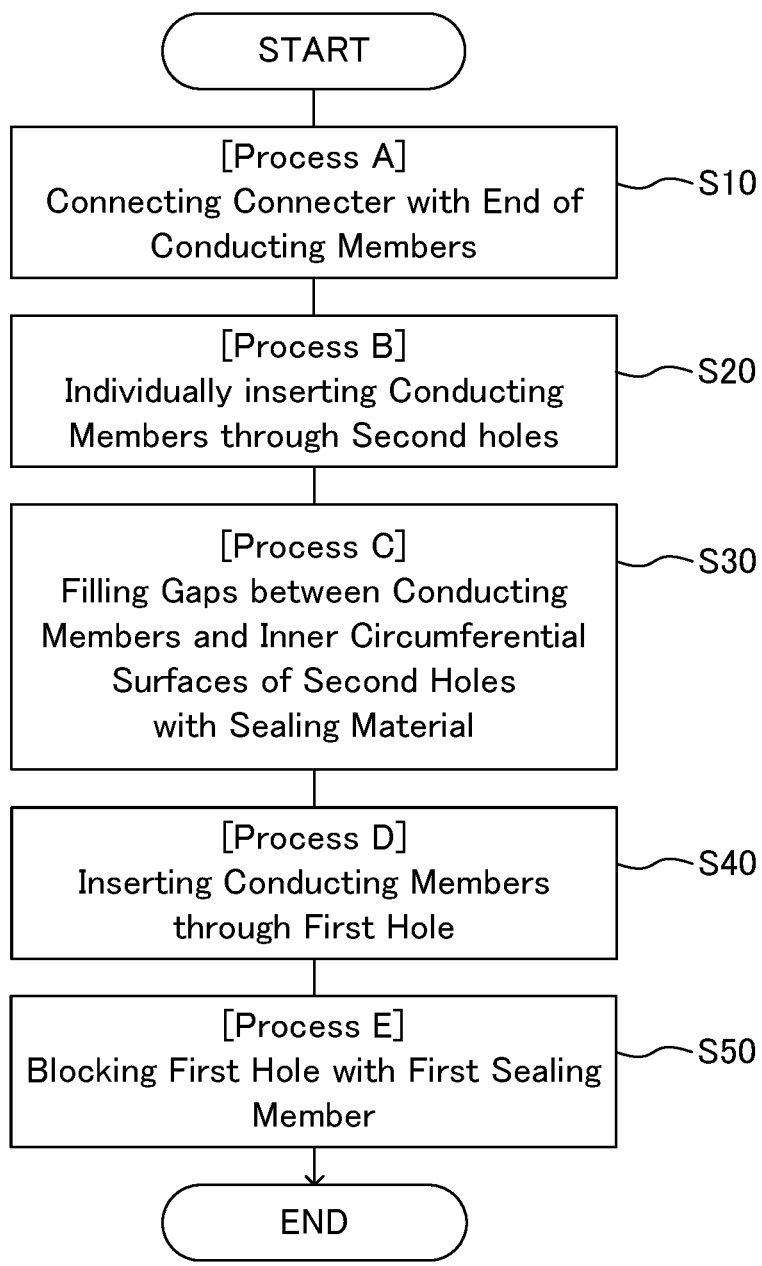
FIG. 5 is a flow chart for showing an example of a flow of respective processes included in a production method of the airtight connection assembly according to the first embodiment of the present invention (first method).

FIG. 5 is a flow chart for showing an example of a flow of respective processes included in the first method. In the first method exemplified in FIG. 5, respective steps are performed in order of S10, S20, S30, S40, and S50. Namely, in the first method of exemplified in FIG. 5, the above-mentioned respective processes are performed in order of "Process A, Process B, Process C, Process D, Process E."

However, execution sequence of the above-mentioned processes A to E included in the first method does not necessarily have to be as mentioned above, and the execution sequence of the respective processes can be appropriately changed according to the configuration of the airtight container to which the first assembly is applied and the surrounding environment of the airtight container, for example.

Specifically, the first assembly 201 exemplified in FIG. 2 can be assembled from the first unit 101 exemplified in FIG. 1 through procedures shown below, for example. First, the external connector 121 is connected to one end of the two conducting members 210. Next, each of the conducting members 210 connected to the external connector 121 is individually inserted into the two second holes 111*a* formed in the first sealing member 111 from an end opposite to the external connector 121. Then, a gap between the inner circumferential surface of each second hole 111*a* and the conducting member 210 is filled with the sealing material 113 and the sealing material 113 is cured (hardened). Ends opposite to the external connector 121 of the conducting members 210 constituting the assembly consisting of the external connector 121, the conducting members 210 and the first sealing member 111 assembled in this way, are inserted to the first hole 311 formed in the partition 310 of the airtight container 300.

Furthermore, the first sealing member 111 is fixed to a predetermined position of the partition 310 of the airtight container 300 with a bolt, which are not shown, and the first hole 311 is covered with the first sealing member. In addition, the ends opposite to the external connector 121 of the conducting members 210 are connected to apparatus or equipment (not shown), such as a sensor, for example, disposed inside the airtight container 300. This connection may be a direct connection to terminals of the apparatus or equipment, or may be a connection through the inner connector 122 which the first unit 101 exemplified in FIG. 1 comprises. Moreover, when the internal connector 122 can pass the first hole 311, the conducting members 210 may be connected to the internal connector 122 before fixing the first sealing member 111 to the predetermined position on the partition 310 of the airtight container 300.

Effect

As explained above, in the first unit, the sealing part and the connecting part can be constituted by general-purpose constituting members which can be obtained easily, such as a metal plate and a connector, etc., which are commercially available, for example. As a result, in accordance with the first unit, an airtight connection assembly which makes it possible to deliver and receive an electric signal, etc., between the inside and outside of an airtight container while maintaining airtightness of the airtight container with a simple configuration can be provided.

Moreover, the first assembly is an airtight connection assembly comprising the first unit, conducting members, in which the sealing part further comprises a sealing material, wherein the conducting members are individually inserted into the second holes, gaps between the conducting members and the inner circumferential surfaces of the second holes are filled with the sealing material, and a connector is connected to either or both of ends of the conducting members. As a result, in accordance with the first assembly, the airtight container which makes it possible to deliver and receive an electric signal, etc., between the inside and outside of an airtight container while maintaining airtightness of the airtight container with a simple configuration can be provided.

Furthermore, the first container is an airtight container comprising the first assembly, wherein the first hole is blocked by the first sealing member and the conducting members inserted through the first hole through the second holes formed in the first sealing member are extending outside from the inside of the first container. As a result, in the first container, an electric signal, etc., can be delivered and received between the inside and outside of the first container while maintaining the airtightness of the first container with a simple configuration.

In addition, the first vaporizer comprises the first container. As a result, the airtightness of the first container can be maintained with a simple configuration while making it possible to deliver and receive an electric signal, etc., between the inside and outside of the first container, as already mentioned in the explanation about the first container. Therefore, in accordance with the first vaporizer, since leakage of a gas from a tank housed inside the first container to the outside of the first container and invasion of foreign substances (for example, a surrounding gas, etc.) into the inside of the above-mentioned tank, etc. can be reduced, a vaporizer having high safety with a simple configuration can be provided.

On the other hand, in the first method that is a production method of the first assembly having the configuration as mentioned above, connecting the conducting members and the connector (Process A), inserting the conducting members into the second holes of the first sealing member (Process B), filling gaps between the inner circumferential surfaces of the second holes and the conducting members with the sealing material (Process C), inserting the conducting members into the first hole of the airtight container (Process D) and blocking the first hole by fixing the first sealing member to a predetermined position on the partition of the airtight container (Process E) can be performed individually. Therefore, in accordance with the first method, the first assembly that can attain the effects as mentioned above can be easily manufactured with concise and highly flexible processes.

Second Embodiment

<Configuration>
(1) Airtight Connection Unit

Hereafter, an airtight connection unit according to a second embodiment of the present invention (which may be referred to as a "second unit" hereafter) is explained, referring to drawings.

In the airtight connection units according to the various embodiments of the present invention including the above-mentioned first unit (the present invention unit), the sealing part and the connecting part can be constituted by general-purpose constituting members which can be obtained easily, such as a metal plate and a connector, which are commercially available, for example. As a result, in accordance with the present invention unit, an airtight connection assembly which makes it possible to deliver and receive an electric signal, etc., between the inside and outside of an airtight container while maintaining airtightness of the airtight container with a simple configuration can be provided.

By the way, for example, when the conducting members are constituted by a flexible material, the connector connected to either or both of ends of the conducting members and/or the conducting members themselves can move flexibly. As a result, in some cases, workability can be improved when fixing the first sealing member to a predetermined position on the partition of the airtight container as mentioned above, for example. However, depending on a situation around a position to which the airtight connection assembly constituted by the present invention unit is attached, etc., it may be difficult to carry out the operation for fixing the first sealing member when the connector and/or the conducting members can move flexibly. Moreover, depending on the configuration of the conducting members, the conducting members may be damaged due to bending and/or deformation thereof when being attached to the airtight container, etc., for example.

Therefore, the second unit is an airtight connecting unit which further comprises a coupling part including a coupling member, in addition to the constituting members which the above-mentioned first unit comprises. The coupling member is a member which can combine at least one of the above-mentioned connectors with the first sealing member to fix a positional relation of the connector and the first sealing member.

The specific configurations of the coupling member is not limited particularly, as long as it is possible to combine at least one of the connectors with the first sealing member such that the positional relation of the connector and the first sealing member is fixed. For example, the coupling member can include a connector holding member that is a member for holding the above-mentioned connector and a connector supporting member that is a member for combining the first sealing member and the connector holding member to support the connector holding member. In this case, the connector holding member and the connector supporting member may be configured as separate members or may be integrally configured as one member.

In addition, as mentioned above, in the first unit, the second holes passing through the first sealing member are formed such that the conducting members inserted into the first hole, which is a penetration hole formed in the partition of the airtight container, can be further inserted thereto. Then, when the first assembly is assembled from the first unit, the conducting members are individually inserted into the second holes, and gaps between the conducting members and the inner circumferential surfaces of the second holes are filled with the sealing material, respectively. Therefore, in the second unit, it is desirable that the coupling member has a structure which does not hinder or unlikely hiders the operation for filling the gaps with the sealing material even when the gaps between the conducting members and the inner circumferential surfaces of the second holes are filled with the sealing material after combining at least one connector included in the connecting part and the first sealing member by the coupling member.

As a specific example of the configuration of the connecting member as mentioned above, a configuration consisting of a pair of tabular connector supporting members facing each other and a tabular connector holding member combined so as to hang one ends of the pair of the connector supporting members can be exemplified. In this case, when an airtight connection assembly is assembled from the second unit, the gaps between the conducting members and the inner circumferential surfaces of the second holes can be filled with the sealing member through a space between the pair of the connector supporting members. Alternatively, the coupling member may consist of a tabular connector holding member and connector supporting members as a plurality of leg parts extending toward the first sealing member from the connector holding member. In this case, the gaps up between the conducting members and the inner circumferential surfaces of the second holes can be filled with the sealing member through a space between the adjacent leg parts when an airtight connection assembly is assembled from the second unit.

A material which constitutes the coupling member is not particularly limited either, as long as it can withstand a use environment in an intended use of the airtight container to which an airtight connection assembly constituted by the second unit is attached. Typically, the material which constitutes the coupling member is a metal such as aluminum and iron, resin or the composite material thereof, for example.

Figure 6:
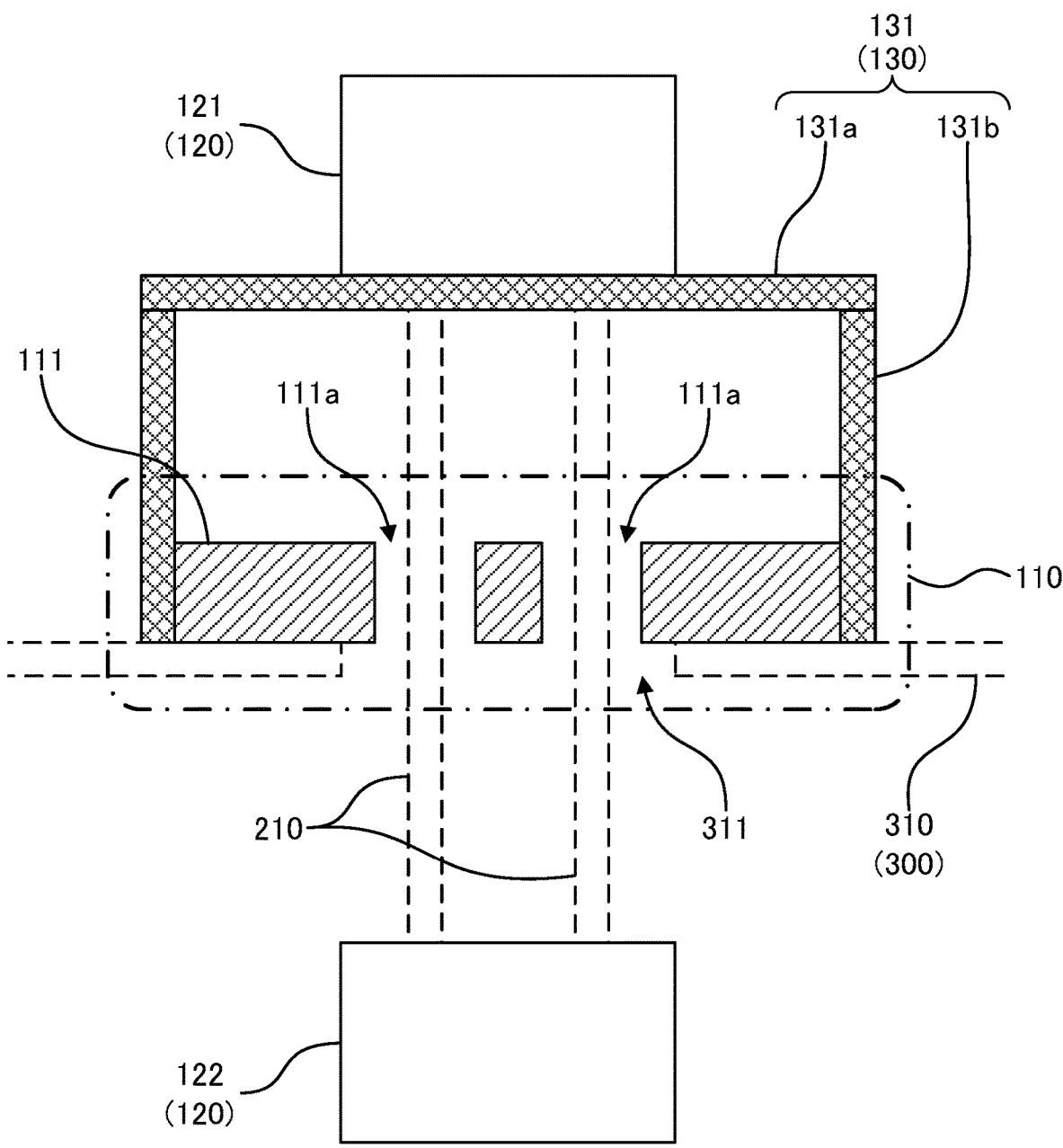
FIG. 6 is a schematic sectional view for showing an example of a configuration of an airtight connection unit according to a second embodiment of the present invention (second unit).

FIG. 6 is a schematic sectional view for showing an example of a configuration of the second unit. The second unit 102 illustrated in FIG. 6 is also in a state where the first sealing member 111 is fixed to the partition 310 of the airtight container 300 with bolts, which are not shown, so as to cover the first hole 311, to block the first hole 311, similarly to the above-mentioned FIG. 1. Moreover, the partition 310 of the airtight container 300 to which an airtight connection assembly constituted by the second unit 102 is attached and the conducting members 210 are illustrated with a dashed line.

The second unit 102 exemplified in FIG. 6 further comprises a coupling part 130 including a coupling member 131 that is a member configured so as to combine an external connector 121 with the first sealing member 111 to fix a positional relation of the external connector 121 and the first sealing member 111. Except for this point, the second unit 102 has the same configuration as that of the first unit 101 exemplified in FIG. 1. Therefore, in the following explanation about the second unit 102, the above-mentioned difference will be mainly explained.

As exemplified in FIG. 6, the coupling member 131 included in the coupling part 130 which the second unit 102 comprises consists of a connector holding member 131a and connector supporting members 131b (diagonal checkered parts). The connector holding member 131a is a member for holding the external connector 121. The connector supporting members 131b are a pair of tabular members facing each other, and the connector holding member 131a is combined so as to hang one ends of the pair of the connector supporting members 131b. By fixing the other ends of the pair of these connector supporting members 131b to outer edge parts of the first sealing member 111, a positional relation between the external connector 121 and the first sealing member 111 can be fixed. When assembling an airtight connection assembly from the second unit 102 exemplified in FIG. 6, gaps between the conducting members 210 and the inner circumferential surfaces of the second holes 111a can be easily filled with the sealing material 113 through a space between the pair of the connector supporting members 131b (which will be mentioned in detail later).

(2) Airtight Connection Assembly

Hereafter, an airtight connection assembly according to the second embodiment of the present invention (which may be referred to as a "second assembly" hereafter) will be explained, referring to drawings.

The second assembly is an airtight connecting assembly which comprises the above-mentioned second unit as an airtight connection unit in addition to the constituting members which the above-mentioned first assembly comprises, at least one connector and the first sealing member is combined by the coupling part, and thereby the positional relation between the connector and the first sealing member is fixed. Since the specific configurations of the second unit constituting the second assembly and the coupling part which the second unit comprises had been already mentioned in the explanation about the above-mentioned second unit, the explanation thereof is omitted here.

Figure 7:
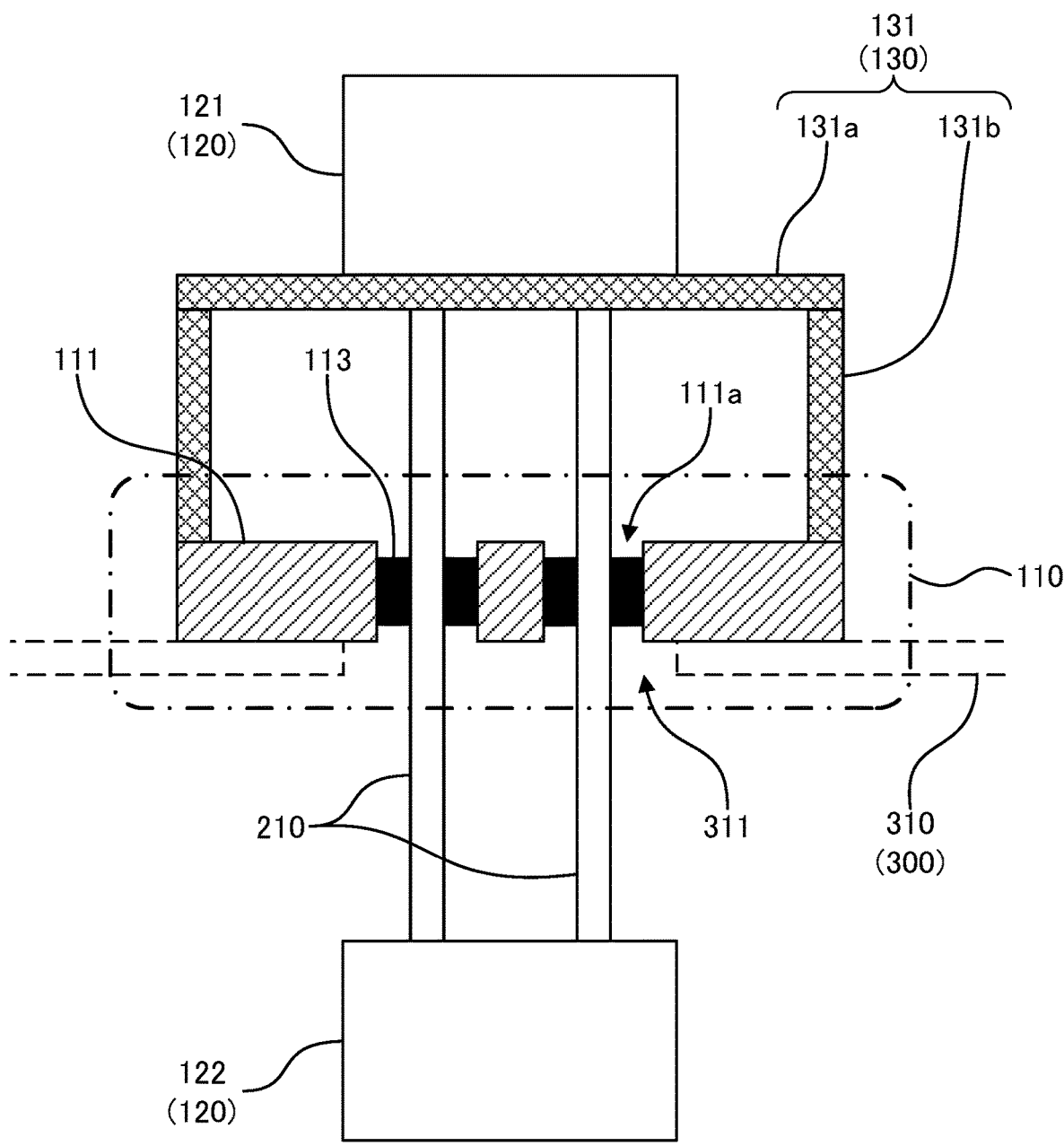
FIG. 7 is a schematic sectional view for showing an example of a configuration of an airtight connection assembly according to the second embodiment of the present invention (second assembly).

FIG. 7 is a schematic sectional view for showing an example of a configuration of the second assembly. As exemplified in FIG. 7, the coupling member 131 included in the coupling part 130 which the second assembly 202 comprises consists of the connector holding member 131a and the connector supporting members 131b (diagonal checkered parts). The connector holding member 131a is a tabular component for holding the external connector 121. The connector supporting members 131b are a plurality of columnar (rod-shaped) or tabular members configured as leg parts extending toward the first sealing member 111 from the connector holding member 131a. The connector holding member 131a is combined so as to hang one ends of the plurality of these connector supporting members 131b. Furthermore, the other ends of the plurality of these connector supporting members 131b are fixed to a surface (a surface on a side opposite to the partition 310 of the airtight container 300) of the first sealing member 111. Thereby, the positional relation between the external connector 121 and the first sealing member 111 is fixed. As a result, in the second assembly 202 exemplified in FIG. 7, gaps between the conducting members 210 and the inner circumferential surfaces of the second holes 111a can be easily filled with the sealing material 113 through a space between the plurality of the connector supporting members 131b.

(3) Airtight Container

Hereafter, an airtight container according to the second embodiment of the present invention (which may be referred to as a "second container" hereafter) will be explained, referring to drawings.

The second container is an airtight connection assembly which comprises the above-mentioned second assembly as the above-mentioned airtight connection assembly in addition to the constituting members which the above-mentioned first container comprises. Since the specific configurations of the second assembly which constitutes the second container and the coupling part which the second assembly comprises had been already mentioned in the explanation about the above-mentioned second assembly, the explanation thereof is omitted here.

Figure 8:
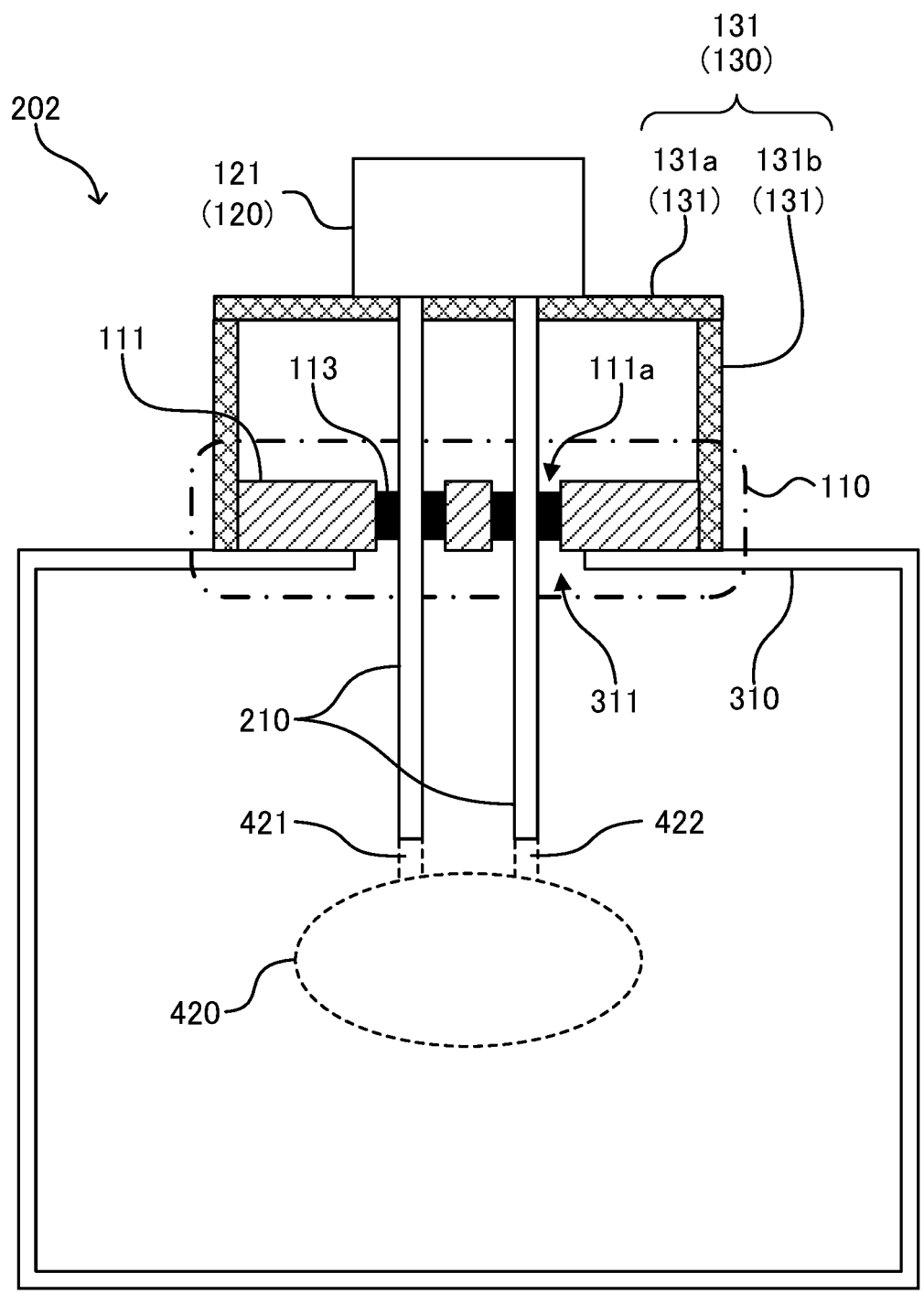
FIG. 8 is a schematic sectional view for showing an example of a configuration of an airtight container according to the second embodiment of the present invention (second container).

FIG. 8 is a schematic sectional view for showing an example of a configuration of the second container. The second container 302 exemplified in FIG. 8 is further comprises a coupling part 130 including a coupling member 131 that is a member configured so as to combine an external connector 121 and a first sealing member 111 to fix a positional relation between the external connector 121 and the first sealing member 111. Except for this point, the second container 302 has the same configuration as the first container 301 exemplified in FIG. 3. Therefore, in the following explanation about the second container 302, the above-mentioned difference will be mainly explained.

As exemplified in FIG. 8, the coupling member 131 included in the coupling part 130, which the second assembly 202 constituting the second container 302 comprises, consists of a connector holding member 131a and connector supporting members 131b (diagonal checkered parts). The connector holding member 131a is a member for holding the external connector 121. The connector supporting members 131b are a pair of tabular members facing each other, and the connector holding member 131a is combined so as to hang one ends of the pair of the connector supporting members 131b. By fixing the other ends of the pair of these connector supporting members 131b to outer edge parts of the first sealing member 111, a positional relation between the external connector 121 and the first sealing member 111 is fixed.

Moreover, when assembling the second container 302 exemplified in FIG. 8, gaps between the conducting members 210 and the inner circumferential surfaces of the second holes 111a can be easily filled with the sealing material 113 through a space between the pair of the connector supporting members 131b.

(4) Vaporizer

Hereafter, a vaporizer according to the second embodiment of the present invention (which may be referred to as a "second vaporizer" hereafter) will be explained.

The second vaporizer is a vaporizer which comprises the second container as an airtight container in place of the above-mentioned first container, in addition to the constituting members which the above-mentioned first vaporizer comprises. Since details of the second container had been already mentioned in the explanation about the above-mentioned second container, the explanation thereof and reference to drawings are omitted here.

(5) Production Method of Airtight Connection Assembly

Hereafter, a production method of an airtight connection assembly according to the second embodiment of the present invention (which may be referred to as a "second method" hereafter) will be explained, referring to drawings.

The second method is a method for assembling the above-mentioned second assembly from the second unit in place of the above-mentioned first unit. Namely, the airtight connection assembly manufactured by the second method further comprises the coupling part comprising the coupling member that is a member for combining at least one connector and the first sealing member to fix a positional relation between the connector and first sealing member. Therefore, in addition to the configuration which the above-mentioned first method comprises, the second method further includes a Process F shown below.

Process F: Combining at least one connector and the first sealing member by the coupling member to fix a positional relation between the connector and the first sealing member.

Figure 9:
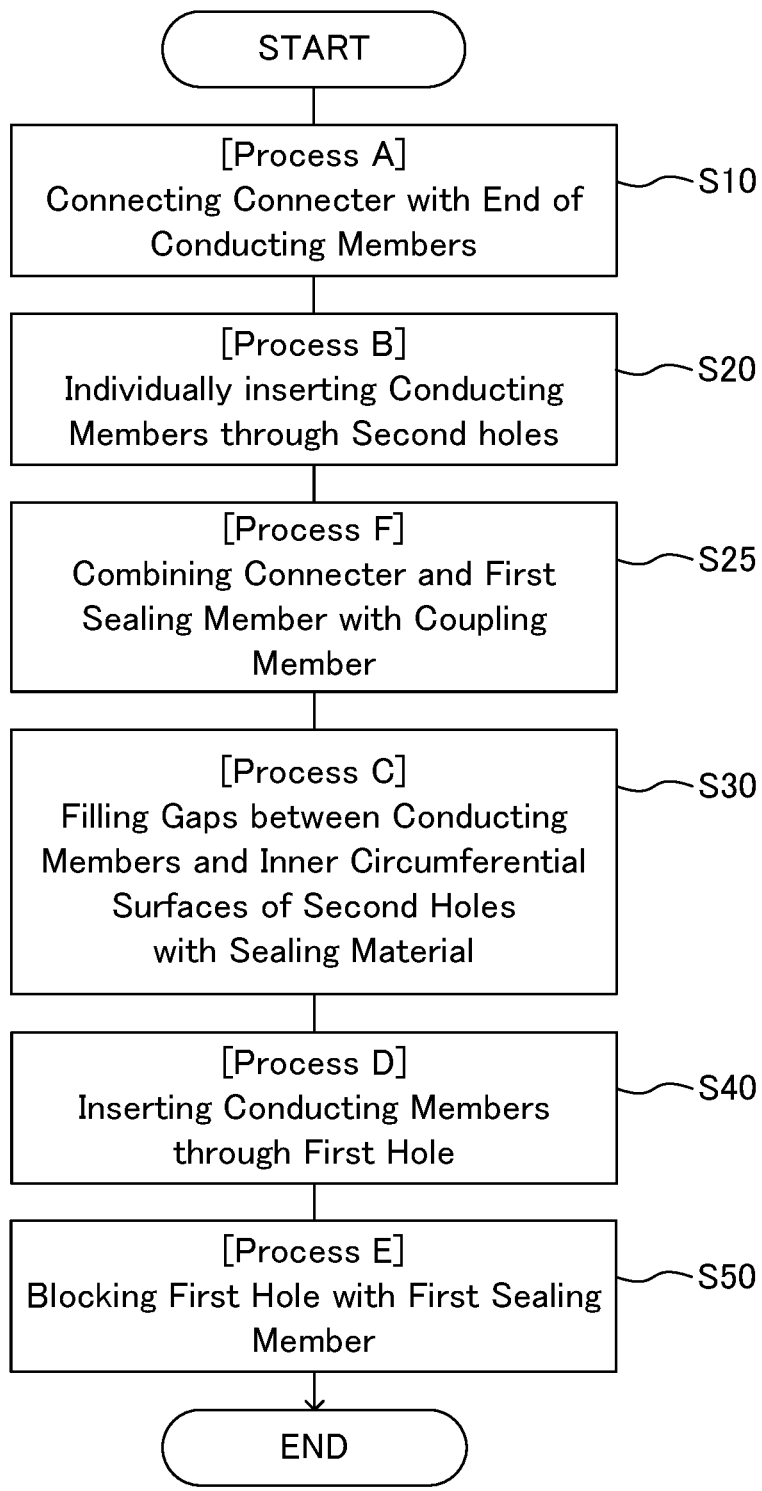
FIG. 9 is a flow chart for showing an example of a flow of respective processes included in a production method of the airtight connection assembly according to the second embodiment of the present invention (second method).

Since respective elements constituting the second assembly had been already mentioned in the explanation about the above-mentioned second assembly, the explanation thereof is omitted here. FIG. 9 is a flow chart for showing an example of a flow of respective processes included in the second method. In the second method exemplified in FIG. 9, respective steps are performed in order of S10, S20, S25, S30, S40 and S50. Namely, in the second method exemplified in FIG. 9, the above-mentioned respective processes are performed in order of "Process A, Process B, Process F, Process C, Process D, Process E." However, execution sequence of the Processes A to E and Process F included in the second method does not necessarily have to be as mentioned above, and the execution sequence of the respective processes can be appropriately changed according to the configuration of the airtight container to which the second assembly is applied and the surrounding environment of the airtight container, etc., for example.

Effect

As explained above, the second unit is an airtight connection unit further comprising the coupling part including the coupling member that is a member which can combine at least one above-mentioned connector and the first sealing member to fix the positional relation between the connector and the first sealing member, in addition to the configuration which the above-mentioned first unit comprises. Therefore, in accordance with the second unit, the positional relation between at least one connector included in the connecting part and the first sealing member can be fixed by combining the connector and the first sealing member with the coupling member. As a result, problems such as reduction of efficiency in the operation for fixing the first sealing member and/or damage of the conducting members in the process of assembling the second assembly can be reduced even when the connector and/or the conducting members can move flexibly, for example. Moreover, as a matter of course, the same effect is attained also in the process of assembling the second assembly in the manufacturing process of the second container and the second vaporizer.

In addition, in the second method, connecting the conducting members and the connector (Process A), inserting the conducting members into the second holes of the first sealing member (Process B), combining the connector and the first sealing member with the coupling member (Process F), filling gaps between the inner circumferential surfaces of the second holes and the conducting members with the sealing material (Process C), inserting the conducting members into the first hole of the airtight container (Process D) and blocking the first hole by fixing the first sealing member to a predetermined position on the partition of the airtight container (Process E) can be performed individually. Therefore, in accordance with the second method, the second assembly which can attain the effects as mentioned above and make it possible to deliver and receive an electric signal etc. between the inside and outside of an airtight container while maintaining airtightness of the airtight container with a concise configuration can be easily manufactured.

Third Embodiment

<Configuration>
(1) Airtight Connection Unit

Hereafter, an airtight connection unit according to a third embodiment of the present invention (which may be referred to as a "third unit" hereafter) will be explained, referring to drawings.

In airtight connection assemblies constituted by the airtight connection units according to various embodiments of the present invention including the above-mentioned first unit and second unit (present invention unit), the first hole is blocked by covering the first hole that is a penetration hole formed in the partition of the airtight container with the first sealing member and airtightness is attained. However, it may be difficult to attain sufficient airtightness by the configurations as mentioned above, in some intended uses of the airtight container to which the airtight connection assembly is attached. As specific examples of such cases, a case where the partition of the airtight container and/or the first sealing member is not sufficiently flat or a case where the partition of the airtight container and/or the first sealing member is deformed due to stress acting in association with fixing the first sealing member to the partition of the airtight container, etc. can be exemplified, for example.

Therefore, the third unit is an airtight connection unit which further comprises a second sealing member in addition to the constituting members which the above-mentioned first unit or second unit comprises. The second sealing member is a member which can surround the first hole and can intervene between the partition and the first sealing member in a state where an airtight connection assembly constituted by the third unit is attached to an airtight container (which may be referred to as a "state A" hereafter).

The second sealing member reduces leak of a gas via the first hole that is a penetration hole formed in the partition of the airtight container and a gap between the partition of the airtight container and the first sealing member to improve the airtightness of the airtight container in the above-mentioned state A. Therefore, the second sealing member needs to surround the first hole and intervene between the partition of the airtight container and the first sealing member in the state A, as mentioned above.

Although the specific configuration of the second sealing member is not limited particularly as long as the above-mentioned requirements are satisfied, sealing members well-known in the art, such as an O-ring, a packing and a gasket, for example, can be typically adopted as the second sealing member. Alternatively, the same material as the above-mentioned sealing material may be disposed so as to surround the first hole and intervene between the partition of an airtight container and the first sealing member in the state A.

In addition, a structure, such as a groove or a level difference, may be prepared in a part opposite to the second sealing member in the state A of the first sealing member and/or the partition of the airtight container, to facilitate positioning of the second sealing member in the process of assembling the airtight connecting assembly from the third unit easier or to reduce displacement (misregistration) of the second sealing member from its predetermined position.

Moreover, when the first sealing member is fixed to the partition of the airtight container by a fastening member, such as a bolt or a screw, inserted through a penetration hole formed in the partition of the airtight container and/or the first sealing member as mentioned above, there is a possibility that airtightness of the airtight container may be reduced due to leak of a gas through a gap between the fastening member and the penetration holes, for example.

In the case as mentioned above, the second sealing member may be configured so as to surround not only the first hole formed in the partition of the airtight container, but also the penetration hole through which the fastening member is inserted in the state A. Thereby, leakage of a gas through a gap between the penetration hole formed in the partition of the airtight container for inserting the fastening member and the fastening member can be reduced, and decrease in airtightness of the airtight container can be reduced. Alternatively, the second sealing member may be configured so as to surround only the first hole formed in the partition of the airtight container and not to surround the penetration hole through which the fastening member is inserted in state A. Thereby, leakage of a gas through the gap between the penetration hole formed in the first sealing member for inserting the fastening member and the fastening member can be reduced, and the decrease in airtightness of the airtight container can be reduced. In addition to the above, a member, such as packing or a gasket, may be interposed between the partition of the airtight container and the fastening member to reduce decrease in airtightness of the airtight container.

Figure 10:
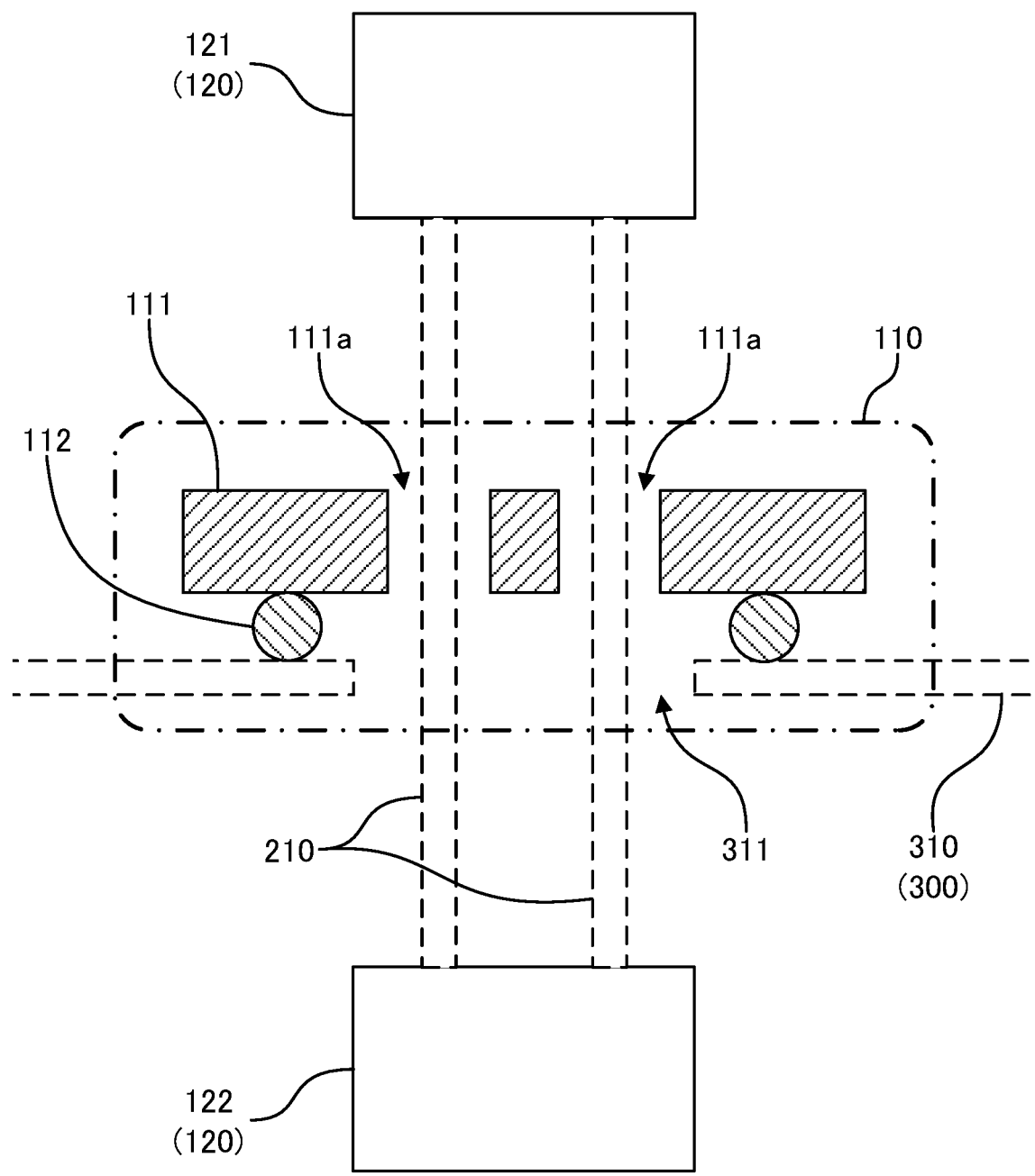
FIG. 10 is a schematic sectional view for showing an example of a configuration of an airtight connection unit according to a third embodiment of the present invention (third unit).

FIG. 10 is a schematic sectional view for showing an example of a configuration of the third unit. The third unit 103 exemplified in FIG. 10 further comprises a second sealing member 112 (part hatched with right-downward diagonal lines) disposed so as to surround the first hole 311 formed in the partition 310 of the airtight container 300 and intervene between the partition 310 of the airtight container 300 and the first sealing member 111 in state A. Except for this point, the third unit 103 has the same configuration as that of the first unit 101 exemplified in FIG. 1. The second sealing member 112 which the third unit 103 exemplified in FIG. 10 comprises is an O-ring.

(2) Airtight Connection Assembly

Hereafter, an airtight connection assembly according to the third embodiment of the present invention (which may be referred to as a "third assembly" hereafter) will be explained, referring to drawings.

The third assembly comprises the above-mentioned third unit as an airtight connection unit, in addition to the constituting members which the above-mentioned first assembly or second assembly comprises. Furthermore, in the third assembly, the second sealing member is disposed so as to surround the first hole and intervene between the partition of the airtight container and the first sealing member in the above-mentioned state A. Since the specific configuration and arrangement, etc. of the second sealing member had been already mentioned in the explanation about the above-mentioned third unit, the explanation thereof is omitted here.

Figure 11:
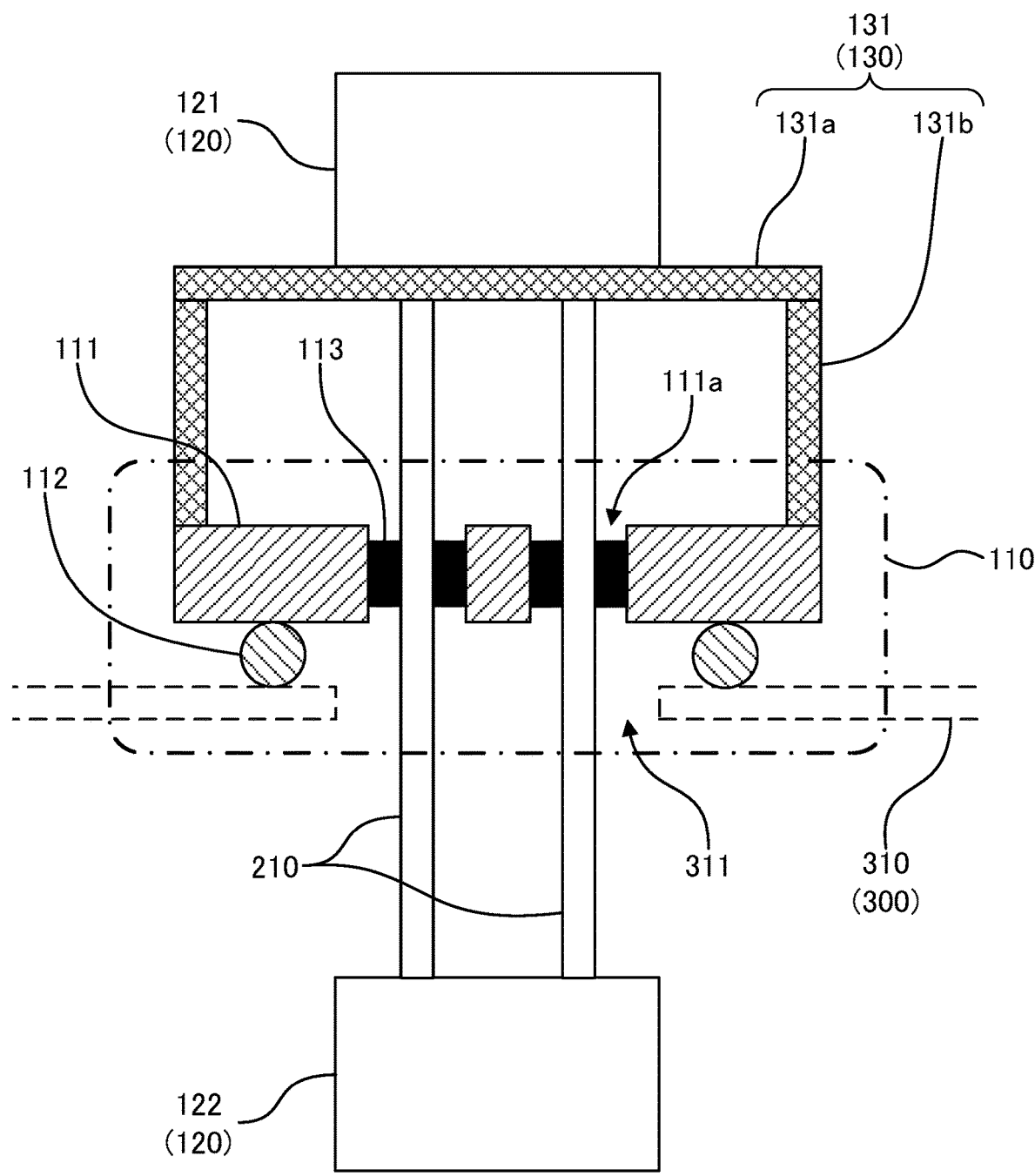
FIG. 11 is a schematic sectional view for showing an example of a configuration of an airtight connection assembly according to the third embodiment of the present invention (third assembly).

FIG. 11 is a schematic sectional view for showing an example of a configuration of the third assembly. In the third assembly 203 exemplified in FIG. 11, the second sealing member 112 is disposed so as to surround the first hole 311 formed in the partition 310 of the airtight container 300 and intervene between the partition 310 of the airtight container 300 and the first sealing member 111 in the state A (part hatched with right-downward diagonal lines). Except for this point, the third assembly 203 has the same configuration as that of the second assembly 202 exemplified in FIG. 7. The second sealing member 112 which the third assembly 203 exemplified in FIG. 11 comprises is an O-ring.

(3) Airtight Container

Hereafter, an airtight container according to the third embodiment of the present invention (which may be referred to as a "third container" hereafter) will be explained, referring to drawings.

The third container comprises the above-mentioned third assembly as an airtight connection assembly in addition to the constituting members which the above-mentioned first container or second container comprises, and the second sealing member is disposed so as to surround the first hole and intervene between the partition of the third container and the first sealing member. Since the specific configuration and arrangement, etc. of the second sealing member had been already mentioned in the explanation about the above-mentioned third assembly, the explanation thereof is omitted here.

Figure 12:
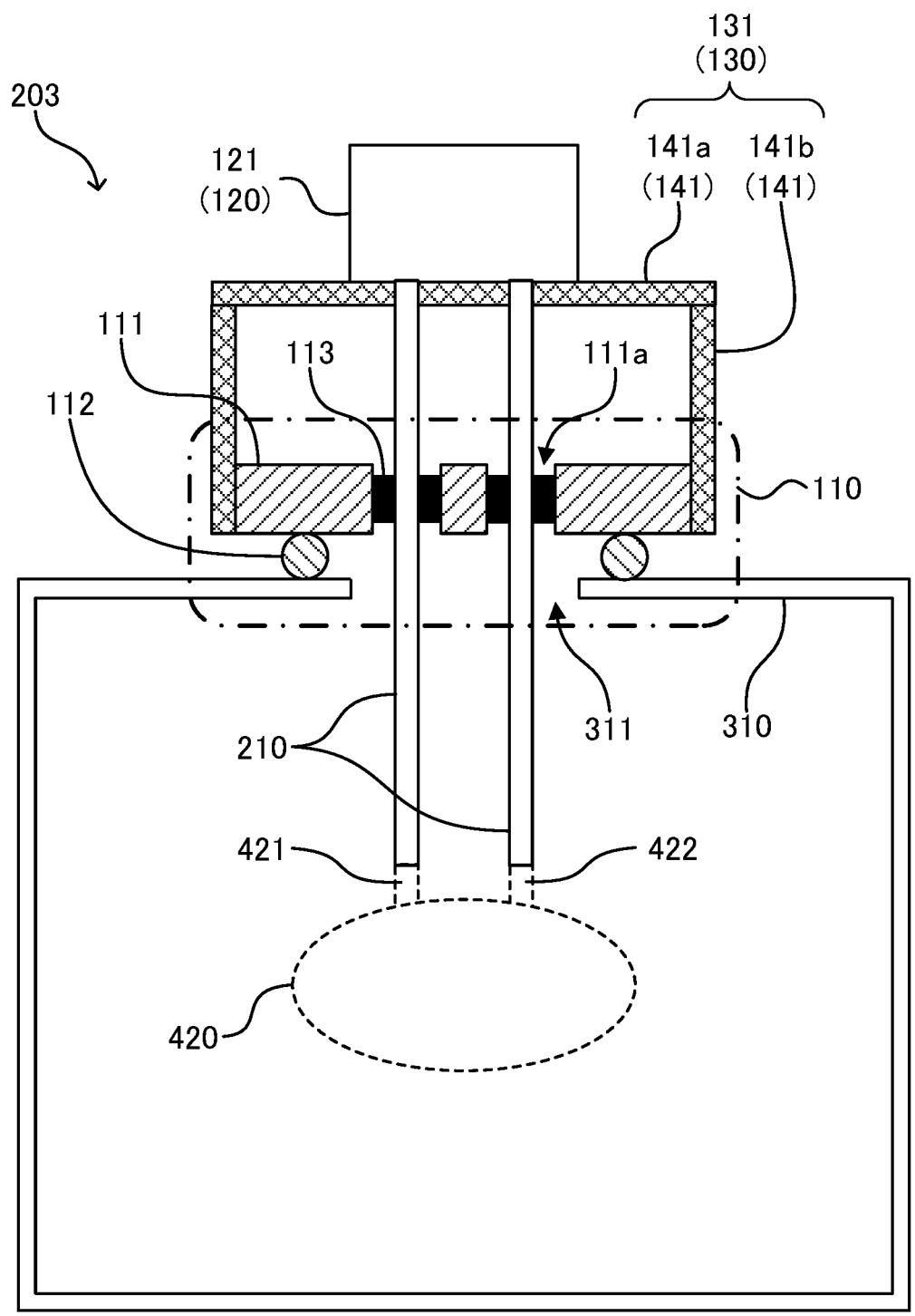
FIG. 12 is a schematic sectional view for showing an example of a configuration of an airtight container according to the third embodiment of the present invention (third container).

FIG. 12 is a schematic sectional view for showing an example of a configuration of the third container. In the third container 303 exemplified in FIG. 12, the second sealing member 112 is disposed so as to surround the first hole 311 formed in the partition 310 of the airtight container 300 and intervene between the partition 310 of the airtight container 300 and the first sealing member 111 in state A (part hatched with right-downward diagonal lines). Except for this point, the third container 303 has the same configuration as that of the second container 302 exemplified in FIG. 8. The second sealing member 112 which the third assembly 203 constituting the third container 303 exemplified in FIG. 12 comprises is an O-ring.

(4) Vaporizer

Hereafter, a vaporizer according to the third embodiment of the present invention (which may be referred to as a "third vaporizer" hereafter) will be explained.

The third vaporizer is a vaporizer which comprises the above-mentioned third container as an airtight container in addition to the constituting members which the above-mentioned first vaporizer or second vaporizer comprises. Since details of the third container had been already mentioned in the explanation about the above-mentioned third container, the explanation thereof and reference to drawing are omitted here.

(5) Production Method of Airtight Connection Assembly

Hereafter, a production method of an airtight connection assembly according to the third embodiment of the present invention (which may be referred to as a "third method" hereafter) will be explained, referring to drawings.

The third method is a method for assembling the above-mentioned third assembly from the above-mentioned third unit. Namely, the airtight connection assembly manufactured by the third method further comprises the second sealing member that is a member which can surround the first hole that is a penetration hole formed in the partition of the airtight container and intervene between the partition and the first sealing member. Therefore, in addition to the configuration which the above-mentioned first method or second method comprises, the third method further includes a Process G and a Process H shown below.

Process G: Inserting the conducting members into the second sealing member.

Process H: Disposing the second sealing member so as to surround the first hole formed in the partition of the airtight container and intervene between the partition and the first sealing member.

Figure 13:
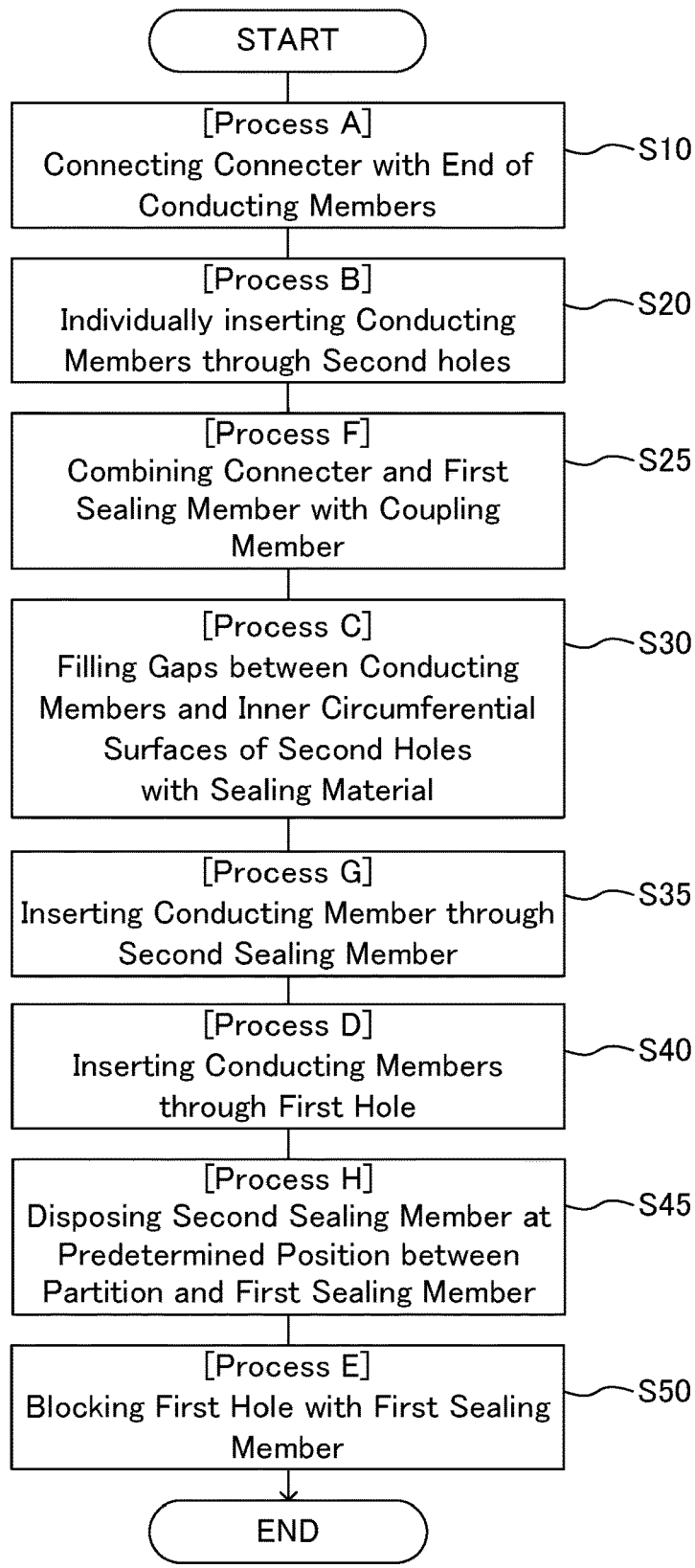
FIG. 13 is a flow chart for showing an example of a flow of respective processes included in a production method of the airtight connection assembly according to the third embodiment of the present invention (third method).

Since respective elements constituting the third assembly had been already mentioned in the explanation about the above-mentioned third assembly, the explanation thereof is omitted here. FIG. 13 is a flow chart for showing an example of a flow of respective processes included in the third method. In the third method exemplified in FIG. 13, respective steps are performed in order of S10, S20, S25, S30, S35, S40, S45 and S50. Namely, in the third method exemplified in FIG. 13, the above-mentioned respective processes are performed in order of "Process A, Process B, Process F, Process C, Process G, Process D, Process H, Process E." However, execution sequence of the Processes A to E and Process F to H included in the third method does not necessarily have to be as mentioned above, and the execution sequence of the respective processes can be appropriately changed according to the configuration of the airtight container to which the third assembly is applied and the surrounding environment of the airtight container, etc., for example.

Effect

As described above, the third unit is an airtight connection unit further comprising the second sealing member that is a member which can surround the first hole and intervene between the partition of the airtight container and the first sealing member in the state (state A) where the airtight connection assembly constituted by the third unit is attached to the airtight container. Therefore, in accordance with the third unit, even in a case where the partition of the airtight container and/or the first sealing member is not sufficiently flat or a case where the partition of the airtight container and/or the first sealing member is deformed due to stress acting in association with fixing the first sealing member to the partition of the airtight container, etc., as mentioned above, airtightness required in the intended use of the third container that is an airtight container comprising the third assembly which is an airtight connection assembly constituted by the third unit and/or the third vaporizer that is a vaporizer comprising the third container can be sufficiently achieved.

In addition, in the third method, connecting the conducting members and the connector (Process A), inserting the conducting members into the second holes of the first sealing member (Process B), combining the connector and the first sealing member with the coupling member (Process F), filling gaps between the inner circumferential surfaces of the second holes and the conducting members with the sealing material (Process C), inserting the conducting members into the second sealing member (Process G), inserting the conducting members into the first hole of the airtight container (Process D), disposing the second sealing member at a predetermined position between the partition of the airtight container and the first sealing member (Process H) and blocking the first hole by fixing the first sealing member to a predetermined position on the partition of the airtight container (Process E) can be performed individually. Therefore, in accordance with the third method, the third assembly which can attain the effects as mentioned above and make it possible to deliver and receive an electric signal etc. between the inside and outside of an airtight container while maintaining airtightness of the airtight container with a concise configuration can be easily manufactured with concise and highly flexible processes.

Working Example

Figure 14:
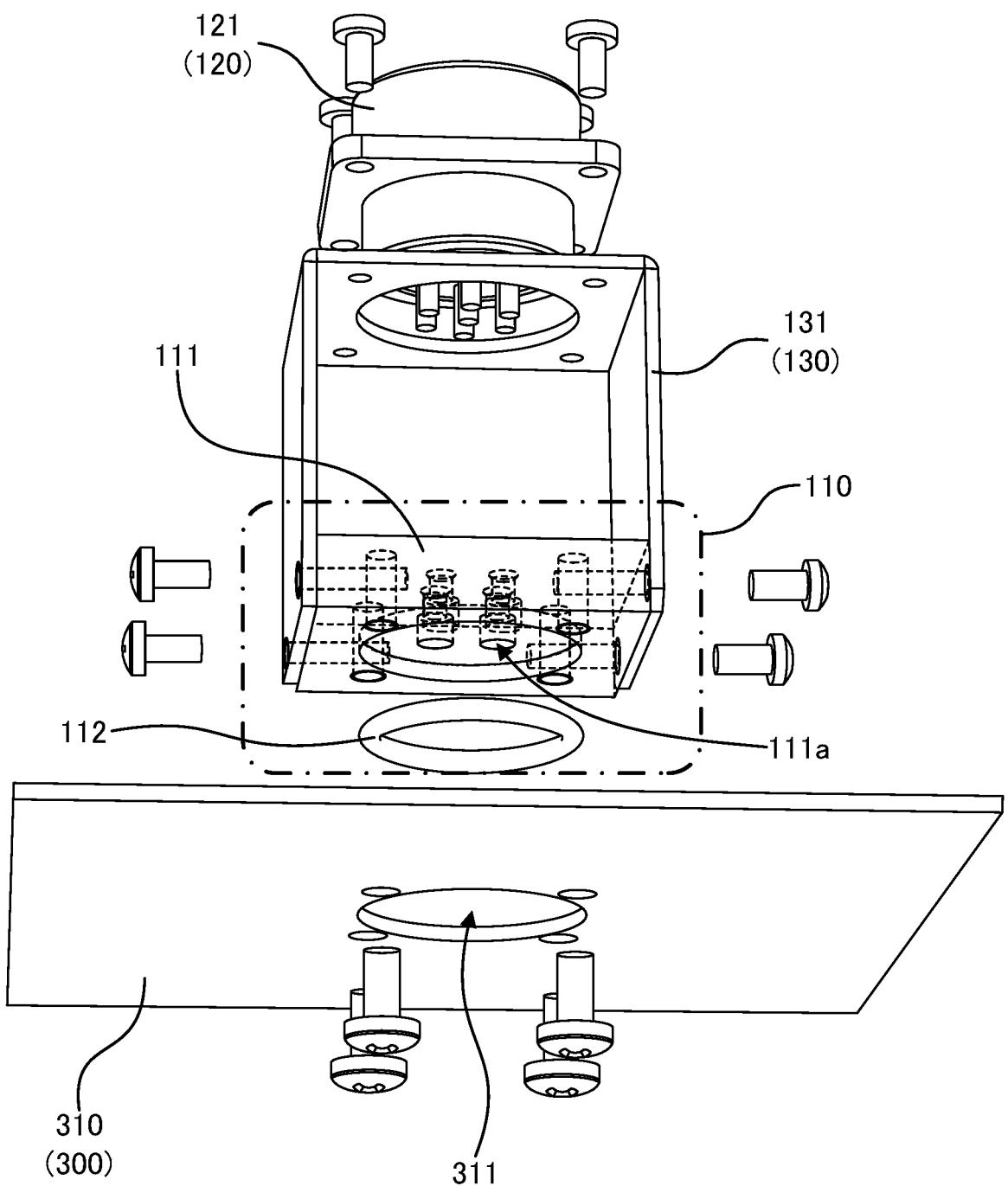
FIG. 14 is a schematic exploded perspective view for showing an example of a configuration of an airtight connection assembly according to a working example of the present invention (working example assembly).
Figure 15:
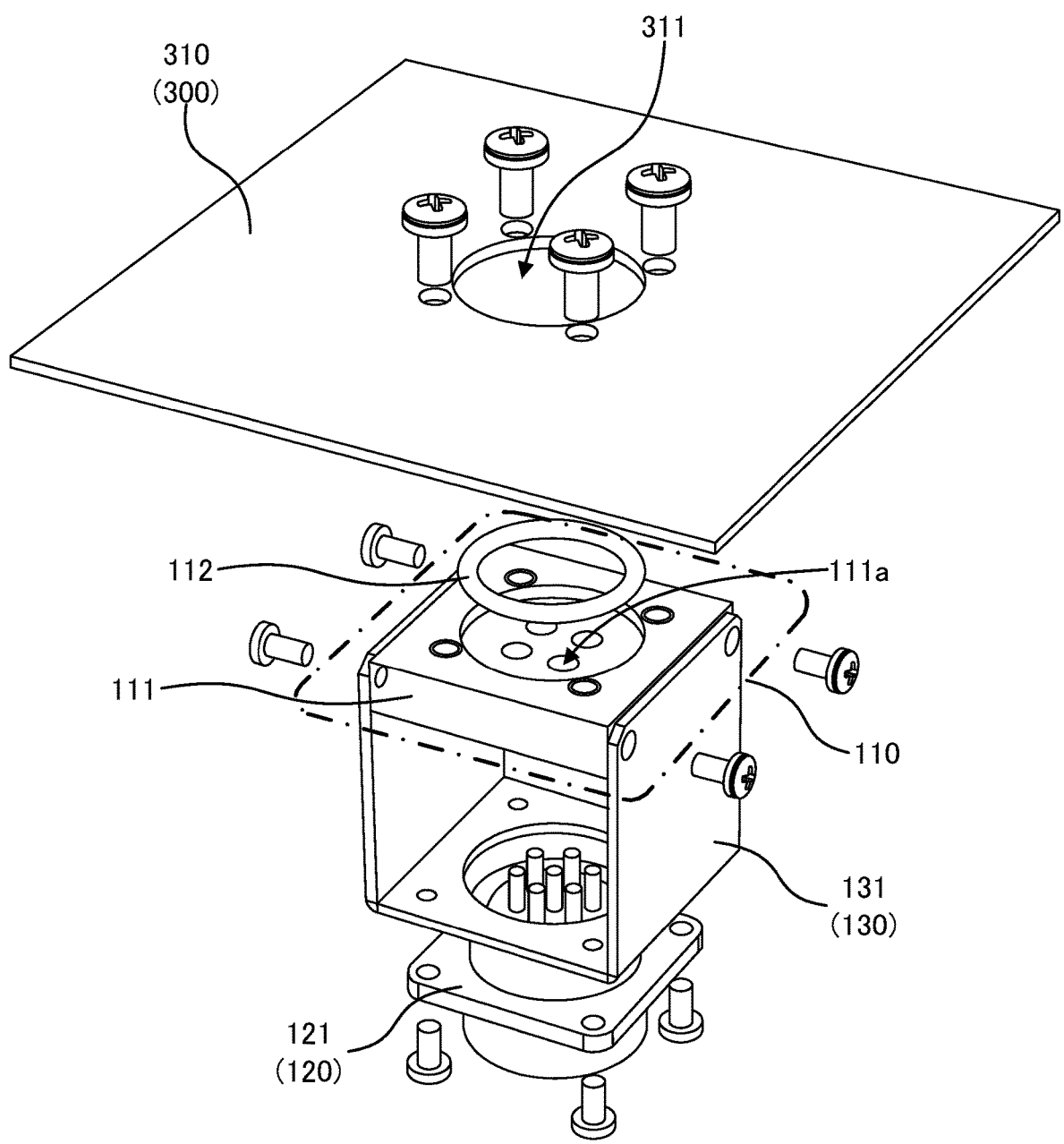
FIG. 15 is a schematic exploded perspective view of the working example assembly shown in FIG. 14 in an upside down fashion.

Hereafter, an airtight connection assembly according to a working example of the present invention (which may be referred to as a "working example assembly" hereafter) will be explained in more detail, referring to drawings.
<Configuration>
FIG. 14 is a schematic exploded perspective view for showing an example of a configuration of the working example assembly, and FIG. 15 is a schematic exploded perspective view of the working example assembly 204 shown in FIG. 14 in an upside down fashion. The working example assembly 204 exemplified in FIG. 14 and FIG. 15 has the same configuration as that of the third assembly 203 exemplified in FIG. 11, except that the number of the second holes 111a formed in the first sealing member 111 in order to insert the conducting members is four and the connecting part 120 does not comprise the internal connector 122. Moreover, in order to facilitate understanding of the configuration of the working example assembly, similarly to FIG. 2, FIG. 7 and FIG. 11, a part of the partition 310 of the airtight container 300 is also illustrated. Furthermore, the sealing material with which the second holes 111a formed in the first sealing member 111 should be filled and the conducting members which should be inserted through the second holes 111a formed in the first sealing member 111 are omitted in both of FIG. 14 and FIG. 15.

As shown in FIG. 14 and FIG. 15, the working example assembly 204 is an airtight connection assembly comprising conducting member which is not shown, the sealing part 110, and the connecting part 120. The conducting member is a member which constitutes a passage of a signal or fluid. The sealing part 110 comprises the first sealing member 111 that is a tabular member made of aluminum having a shape which can cover the first hole 311 that is a penetration hole formed in the partition 310 of the airtight container 300 and a sealing material which is not shown.

Figure 16:
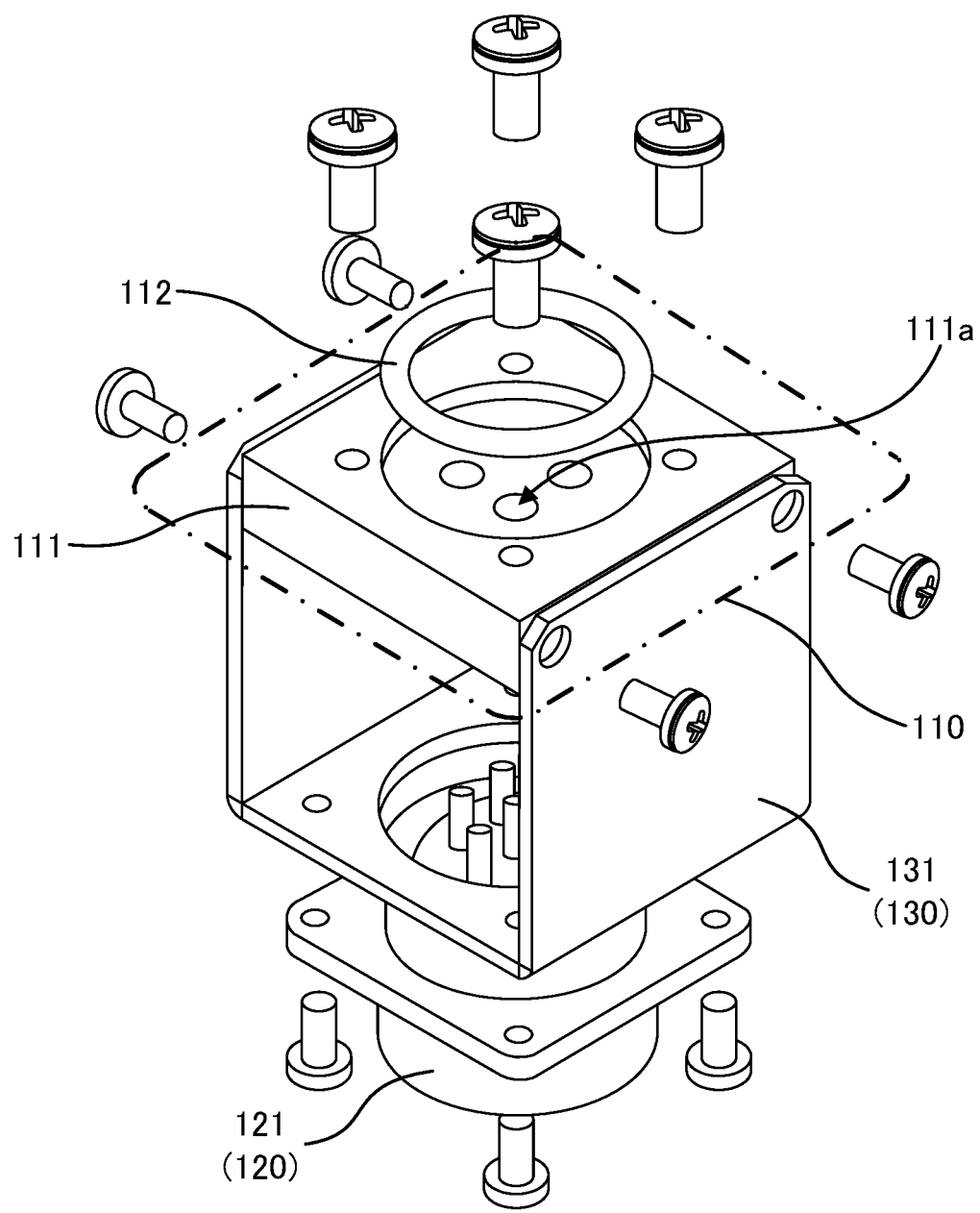
FIG. 16 is a schematic exploded perspective view for showing a positional relation of the second sealing member and a concave portion formed in a surface opposite to the airtight container of the first sealing member which the working example assembly shown in FIG. 14 and FIG. 15 comprises.

By the way, FIG. 16 is a schematic exploded perspective view for showing a positional relation of the second sealing member 112 and a concave portion formed in a surface opposite to the airtight container of the first sealing member which the working example assembly 204 shown in FIG. 14 and FIG. 15 comprises. As shown in FIG. 14 to FIG. 16, a circular (round) concave portion corresponding to a shape of an O-ring as the second sealing member 112 is formed on the surface opposite to the airtight container 300 of the first sealing member 111 which the working example assembly 204 comprises. Thereby, it is possible to facilitate alignment of the O-ring and prevent displacement (misregistration) of the O-ring when attaching the working example assembly 204 to the airtight container 300. In addition, when there is a possibility that the airtightness of the airtight container may be reduced due to a gap between the illustrated bolts for fixing the first sealing member 111 to the airtight container 300 and the penetration holes formed in the partition 310 of the airtight container 300 for inserting the bolts, it is preferable to seal the gap using known means, such as packing and gaskets, etc.

As mentioned above, the connecting part 120 which the working example assembly 204 comprises does not comprise an internal connector, but it comprises only the external connector 121, as the above-mentioned connector. The external connector 121 is a connector for electrically connecting the conduction members which the example assembly 204 comprises and the conduction members which another apparatus or equipment, etc. comprises, at the ends on the external side of the airtight container 300 of the conduction members. Moreover, the second holes 111a, which is four penetration holes formed so as to be communicate with the first hole 311 of the airtight container 300 in a state where the example assembly 204 is attached to the airtight container 300 (state A) are formed in the first sealing member 111. The conduction members are individually inserted into these second holes 111a one by one, and a space between the conduction members and the inner surfaces of the second holes 111a are filled with a sealing material not shown. Thereby, it is possible to deliver and receive electric signals, etc., between the inside and outside of the airtight container 300 through the conductive members extending from the inside to outside of the airtight container 300 while maintaining the airtightness of the airtight container 300.

In the working assembly 204, the sealing part 110 further comprises a second sealing member 112 that is a member which surrounds the first hole 311 formed in the partition 310 of the airtight container 300 and is disposed so as to be interposed between the partition 310 of the airtight container 300 and the first sealing member 111 in the above-mentioned state A. In addition, the working example assembly 204 further comprises a coupling part 130 comprising a coupling member 131 that is a member configured so as to combine the external connector 121 and the first sealing member 111 to fix a positional relationship between the external connector 121 and the first sealing member 111.

The coupling member 131 included in the coupling part 130 which the example assembly 204 comprises consists of a connector holding member which is a tabular member for holding the external connector 121 and connector supporting members which are a pair of tabular members for fixing both ends of the holding member to the first sealing member 111, and these members are formed integrally. In addition, the external connector 121 is fixed and held at the connector holding member in a state where connection terminals are inserted through penetration holes formed in the tabular connector holding member. Namely, the external connector 121 exemplified in FIG. 14 to FIG. 16 is what is called a "receptacle", and a commercially available general-purpose receptacle can be used as the external connector 121, for example. Since it is enough for the general-purpose receptacle to have functions for insulation and connection of the terminals, and does not need to have a sealing function for achieving airtightness, it possible to select more various connectors as compared to conventional hermetic connectors. Moreover, in general, a general-purpose receptacle can be obtained at a low price.

Figure 17:
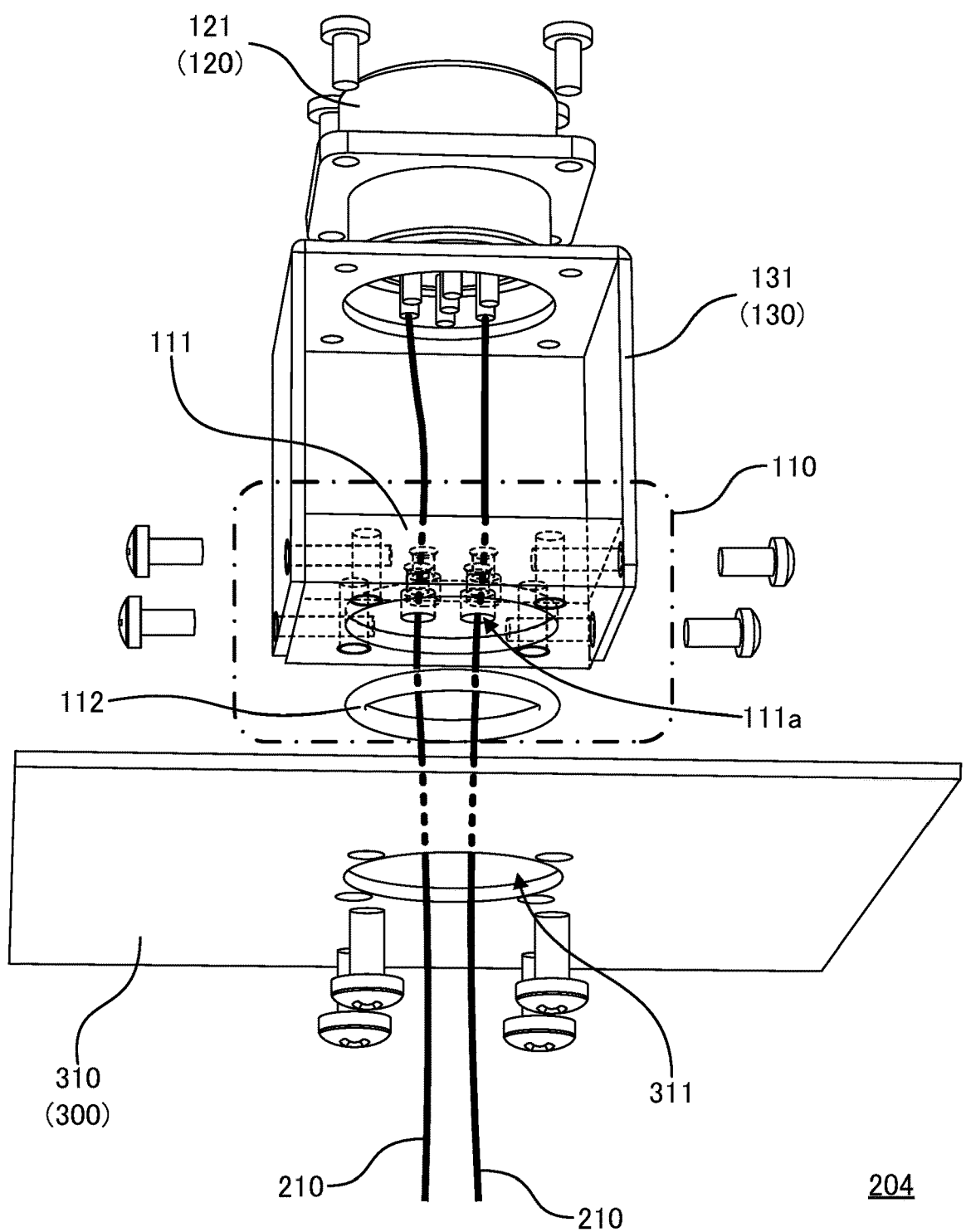
FIG. 17 is a schematic exploded perspective view for showing a state where the conducting members connected to an external connector which the working example assembly shown in FIG. 14 to FIG. 16 comprises have been inserted through the first hole formed in the partition of the airtight container and the second holes formed in the first sealing member.

Next, an example of procedures for assembling the working example assembly 204 which has the configuration as mentioned above will be explained below, referring to FIG. 17. FIG. 17 is a schematic exploded perspective view for showing a state where the conducting members 210 connected to the external connector 121 which the working example assembly 204 shown in FIG. 14 to FIG. 16 comprises have been inserted through the first hole 311 formed in the partition 310 of the airtight container 300 and the second holes 111a formed in the first sealing member 111. In FIG. 17 and the following explanation, for the purpose of making FIG. 17 easier to see and legibly explaining the assembling procedures of the working example assembly 204, only the two conducting members 210 are mentioned. However, it is needless to say that it is possible to insert the conduction members 210 individually through all the second holes 111a formed in the first sealing member 111 and to fill gaps between the inner circumference surfaces of the respective second holes 111a and the conducting members 210 with a sealing material to seal them. Alternatively, when the conducting member 210 is not inserted through any of the second holes 111a formed in the first sealing member 111a, the airtightness of the airtight container 300 can be achieved by filling the second holes 111a with a sealing material to seal it.

First, as shown in FIG. 17, the conducting members 210 are connected respectively to predetermined terminals of the external connector 121 (Process A), the conducting members 210 are inserted into a penetration hole formed in the coupling member 131 and the external connector 121 is fixed to the coupling member 131 by fastening members. Next, each of the conducting members 210 is inserted individually into each of the two second holes 111a formed in the first sealing member 111 one by one (Process B). Then, the first sealing member 111 is fixed at a predetermined position on the side opposite to the external connector 121 of the coupling member 131 (Process F). Next, gaps between the inner surfaces of the individual second holes 111a are filled with room temperature curing silicon sealant as a sealing material, not shown, and the sealant is cured (hardened) and the conduction members 210 (Process C).

The conduction members 210 projecting from the second holes 111a of the first sealing member 111 of the thus assembled assembly consisting of the external connector 121, the conduction members 210, the coupling member 131, the first sealing member 111 and the sealing material are inserted into the O-ring as the second sealing member 112 and the first hole 311 formed in the partition 310 of the airtight container 300 (Process G and Process D). Then, a state where the O-ring is partially fitted into the concave part formed on the surface opposite to the airtight container 300 of the first sealing member 111 to be aligned is attained (Process H), and, in this state, the first sealing member 111 is fixed at a predetermined position of the partition 310 of the airtight container 300 by the fastening members to block the first hole 311 by the first sealing member 111 (Process E). Namely, the working example assembly 204 can be manufactured through the same procedures as those of the above-mentioned production method of an airtight connection assembly according to the third embodiment of the present invention (third method).

In addition, the ends on the side opposite to the external connector 121 of the conduction members 210 are connected to apparatus or equipment (not shown), such as a sensor, disposed inside the airtight container 300. This connection may be a connection through the internal connector 122 similarly to that in the first assembly 201 to the third assembly 203 exemplified in FIG. 2, FIG. 7 and FIG. 11. Alternatively, this connection may be a direct connection between the terminals of the apparatus or equipment, etc. and the conducting members 210 similarly to that in in the first assembly 201 to the third assembly 203 exemplified in FIG. 3, FIG. 8 and FIG. 12.

Effect

Figure 18:
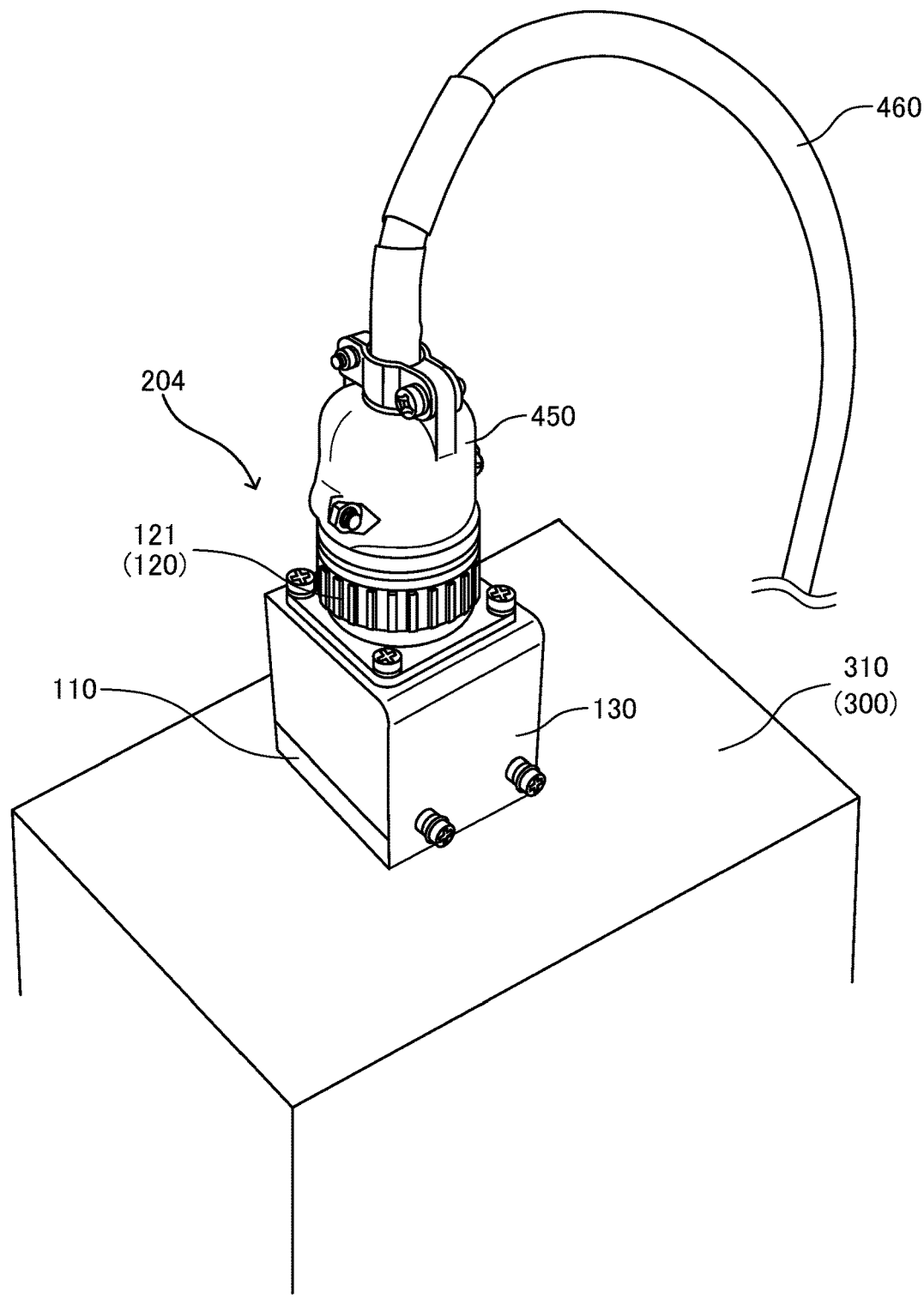
FIG. 18 is a schematic perspective view for showing a situation where the working example assembly shown in FIG. 14 to FIG. 17 has been attached to the airtight container.

FIG. 18 is a schematic perspective view for showing a situation where the working example assembly 204 shown in FIG. 14 to FIG. 17 has been attached to the airtight container 300. A plug 450 is connected to an external connector 121 which the working example assembly 204 exemplified in FIG. 18 comprises, and a cable 460 is connected to the plug 450. Thereby, it is possible to deliver and receive an electric signal, etc. between apparatus or equipment such as a sensor (not shown) disposed inside the airtight container 300 and a control device, etc. (not shown) disposed outside the airtight container 300, for example.

As apparent from FIG. 14 to FIG. 18 and the above explanation, in the working example assembly 204, the sealing part 110 and the connecting part 120 can be constituted by general-purpose constituting members which can be obtained easily, such as a commercially available metal plate and connector, etc., for example. As a result, in accordance with the working example assembly 204, it is possible to deliver and receive an electric signal, etc. between the inside and outside of the airtight container 300 while maintaining the airtightness of the airtight container 300 by a simple configuration.

Moreover, in the working example assembly 204, the sealing part 110 further comprises the second sealing member 112 that is a member disposed so as to surround the first hole 311 and intervene between the partition 310 of the airtight container 300 and the first sealing member 111 in the above-mentioned state A. Therefore, even in a case where the partition 310 of the airtight container 300 and/or the first sealing member 111 is not sufficiently flat or a case where the partition 310 of the airtight container 300 and/or the first sealing member 111 is deformed due to stress acting in association with fixing the first sealing member 111 to the partition 310 of the airtight container 300, etc., as mentioned above, sufficient airtightness can be achieved in the intended use of the airtight container 300 to which the working example assembly 204 is attached can be achieved.

Furthermore, in the working example assembly 204, the external connector 121 and the first sealing member 111 are combined by the coupling member 131, and the positional relation between the external connector 121 and the first sealing member 111 is fixed. Therefore, for example, even in a case where it may be difficult to carry out the operation for fixing the working example assembly 204 to the airtight container 300 if the external connector 121 and/or the conducting members 210 could move flexibly or a case where the conducting members 210 may be damaged by being bended or deformed when attaching them to the airtight container 300, etc., it is possible to reduce problems such as reduction of efficiency in the operation and damage of the conducting members 210, for example.

The above-mentioned effect attained by the working example assembly 204 is attained similarly also in an airtight container to which the working example assembly 204 is attached and a vaporizer which comprises the airtight container, etc.

Although some embodiments and working examples having specific configurations have been explained, sometimes referring to the drawings, as the above, for the purpose of explaining the present inventions, it should not be interpreted that the scope of the present invention is limited to these exemplary embodiments and working examples, and it is needless to say that it is possible to properly add a correction within the limits of the matters described in the claims and the specification.

REFERENCE SIGNS LIST

101: First Unit
102: Second Unit
103: Third Unit
110: Sealing Part
111: First Sealing Member
111*a*: Second Hole
112: Second Sealing Member
113: Sealing Material
120: Connecting Part
121: (External) Connector
122: (Internal) Connector
130: Coupling Part
131: Coupling Member
131*a*: Connector Holding Member
131*b*: Connector Supporting Member
201: First Assembly
202: Second Assembly
203: Third Assembly
204: Working Example Assembly
210: Conducting Member
300: Airtight Container
301: First Container
302: Second Container
303: Third Container
310: Partition
311: First Hole
401: First Vaporizer
410: Tank
420: Sensor
421 and 422: Signal Wire
430: Output Tube
440: Input Tube
450: Plug
460: Cable
510: Flow Controller
520: Flow Meter
530: Chamber

The invention claimed is:

1. An airtight connection unit which makes it possible to deliver and receive a signal or fluid between the inside and outside of an airtight container via one or more conducting members inserted through a first hole passing through a partition of said airtight container, wherein:
   said airtight connection unit comprises;
      a sealing part comprising a first sealing member that is a general-purpose member which has a tabular shape as a whole and is larger than said first hole and can cover said first hole, and
      a connecting part comprising a general-purpose connector which can be connected with either or both of ends of said conducting members, respectively and is a separate member from said conducting members, and
   second holes passing through said first sealing member are formed such that said conducting members inserted through said first hole can be inserted further through said second holes,
   said sealing part further comprises a sealing material for being filled in gaps between said conducting members and inner circumferential surfaces of said second holes to maintain airtightness of said airtight container, and
   insertion positions of said conducting members in said second holes are not restrained by any members other than said sealing material.

2. The airtight connection unit according to claim 1, further comprising;
   a coupling part including a coupling member that is a member which can combine at least one of said connector with said first sealing member to fix a positional relation of said connector and said first sealing member.

3. The airtight connection unit according to claim 2, further comprising;
   a second sealing member that is a member which can surround said first hole and can intervene between said partition and said first sealing member.

4. The airtight connection unit according to claim 1, further comprising;
   a second sealing member that is a member which can surround said first hole and can intervene between said partition and said first sealing member.

5. An airtight connection assembly comprising:
   an airtight connection unit configured to deliver and receive a signal or fluid between an inside and outside of an airtight container via one or more conducting members inserted through a first hole passing through a partition of said airtight container, wherein said airtight connection unit comprises;
      a sealing part comprising a first sealing member that is a member which has a tabular shape as a whole and is larger than said first hole and can cover said first hole, and
      a connecting part comprising a connector which can be connected with either or both of ends of said conducting members, respectively, and
   second holes passing through said first sealing member are formed such that said conducting members inserted through said first hole can be inserted further through said second holes;
   said sealing part further comprises a sealing material, wherein:
   said conducting members are individually inserted through said second holes,
   gaps between said conducting members and inner circumferential surfaces of said second holes are filled with said sealing material, and
   said connector is connected with either or both of ends of said conducting members.

6. The airtight connection assembly according to claim 5, further comprising;
   a coupling part including a coupling member that is a member which can combine at least one of said connector with said first sealing member to fix a positional relation of said connector and said first sealing member.

7. The airtight connection assembly according to claim 6, further comprising;

a second sealing member that is a member which can surround said first hole and can intervene between said partition and said first sealing member.

8. The airtight connection assembly according to claim 5, further comprising;
a second sealing member that is a member which can surround said first hole and can intervene between said partition and said first sealing member.

9. An airtight container comprising:
an airtight connection assembly comprising:
an airtight connection unit configured to deliver and receive a signal or fluid between an inside and outside of an airtight container via one or more conducting members inserted through a first hole passing through a partition of said airtight container, wherein said airtight connection unit comprises;
a sealing part comprising a first sealing member that is a member which has a tabular shape as a whole and is larger than said first hole and can cover said first hole, and
a connecting part comprising a connector which can be connected with either or both of ends of said conducting members, respectively, and
second holes passing through said first sealing member are formed such that said conducting members inserted through said first hole can be inserted further through said second holes;
said sealing part further comprises a sealing material, wherein:
said conducting members are individually inserted through said second holes,
gaps between said conducting members and inner circumferential surfaces of said second holes are filled with said sealing material, and
said connector is connected with either or both of ends of said conducting members;
said first hole is blocked by said first sealing member covering said first hole, and
said conducting members are inserted through said first hole via said second holes to extend outside from the inside of said airtight container.

10. The airtight container according to claim 9, further comprising;
a coupling part including a coupling member that is a member which can combine at least one of said connector with said first sealing member to fix a positional relation of said connector and said first sealing member.

11. The airtight connection unit according to claim 10, further comprising;
a second sealing member that is a member which can surround said first hole and can intervene between said partition and said first sealing member.

12. The airtight container according to claim 9, further comprising;
a second sealing member that is a member which can surround said first hole and can intervene between said partition and said first sealing member.

13. A vaporizer comprising:
an airtight container comprising:
an airtight connection assembly comprising:
an airtight connection unit configured to deliver and receive a signal or fluid between an inside and outside of an airtight container via one or more conducting members inserted through a first hole passing through a partition of said airtight container, wherein said airtight connection unit comprises;
a sealing part comprising a first sealing member that is a member which has a tabular shape as a whole and is larger than said first hole and can cover said first hole, and
a connecting part comprising a connector which can be connected with either or both of ends of said conducting members, respectively, and
second holes passing through said first sealing member are formed such that said conducting members inserted through said first hole can be inserted further through said second holes;
said sealing part further comprises a sealing material, wherein:
said conducting members are individually inserted through said second holes,
gaps between said conducting members and inner circumferential surfaces of said second holes are filled with said sealing material, and
said connector is connected with either or both of ends of said conducting members;
said first hole is blocked by said first sealing member covering said first hole,
said conducting members are inserted through said first hole via said second holes to extend outside from the inside of said airtight container;
a tank housed inside said airtight container, and
a sensor configured so as to output a detection signal corresponding to the amount and/or state of a gas and/or a gas material that is a substance used as a source of said gas housed inside said tank and/or a heater configured so as to be supplied electric power to heat the gas material.

14. The vaporizer according to claim 13, further comprising;
a coupling part including a coupling member that is a member which can combine at least one of said connector with said first sealing member to fix a positional relation of said connector and said first sealing member.

15. The vaporizer according to claim 14, further comprising;
a second sealing member that is a member which can surround said first hole and can intervene between said partition and said first sealing member.

16. The vaporizer according to claim 13, further comprising;
a second sealing member that is a member which can surround said first hole and can intervene between said partition and said first sealing member.

17. A production method of an airtight connection assembly which makes it possible to deliver and receive a signal or fluid between and inside and outside of an airtight container via one or more conducting members inserted through a first hole passing through a partition of said airtight container, wherein said airtight connection assembly comprises a sealing part comprising a first sealing member that is a general-purpose member which has a tabular shape as a whole and is larger than said first hole and can cover said first hole, and a connecting part comprising a general purpose connector which can be connected with either or both of ends of said conducting members, respectively and is a separate member from said conducting members, and second holes passing through said first sealing member are formed such that said conducting members inserted through said first hole can be inserted further through said second holes, and said production method of an airtight connection assembly includes:

connecting said connecter with at least one end of said conducting members, individually inserting said conducting members through said second holes, filling gaps between inner circumferential surfaces of said second holes and said conducting members with a sealing material, inserting said conducting members through said first hole, and fixing said first sealing member at a predetermined position on said partition to block said first hole with said first sealing member, and insertion positions of said conducting members in said second holes are not restrained by any members other than said sealing material.

18. The production method of an airtight connection assembly according to claim 17, wherein:

said airtight connection assembly further comprises a second sealing member that is a member which can surround said first hole and can intervene between said partition and said first sealing member, and said production method of an airtight connection assembly further includes;

inserting said conducting members through said second sealing member, and disposing said second sealing member so as to surround said first hole and intervene between said partition and said first sealing member.

19. The production method of an airtight connection assembly according to claim 17, wherein:

said airtight connection assembly further comprises a coupling part including a coupling member that is a member which can combine at least one of said connector with said first sealing member to fix a positional relation of said connector and said first sealing member, and said production method of an airtight connection assembly includes;

combining at least one of said connector with said first sealing member by means of said coupling member to fix a positional relation of said connector and said first sealing member.

20. The production method of an airtight connection assembly according to claim 19, wherein:

said airtight connection assembly further comprises a second sealing member that is a member which can surround said first hole and can intervene between said partition and said first sealing member, and said production method of an airtight connection assembly further includes;

inserting said conducting members through said second sealing member, and disposing said second sealing member so as to surround said first hole and intervene between said partition and said first sealing member.

* * * * *